United States Patent [19]

Nibby, Jr. et al.

[11] Patent Number: 4,527,251
[45] Date of Patent: Jul. 2, 1985

[54] REMAP METHOD AND APPARATUS FOR A MEMORY SYSTEM WHICH USES PARTIALLY GOOD MEMORY DEVICES

[75] Inventors: Chester M. Nibby, Jr., Peabody; Reeni Goldin, Somerville; Timothy A. Andrews, Arlington, all of Mass.

[73] Assignee: Honeywell Information Systems Inc., Waltham, Mass.

[21] Appl. No.: 450,691

[22] Filed: Dec. 17, 1982

[51] Int. Cl.³ .............................................. G06F 13/00
[52] U.S. Cl. ................................................... 364/900
[58] Field of Search ... 364/200 MS File, 900 MS File

[56] References Cited

U.S. PATENT DOCUMENTS

| 4,047,163 | 9/1977 | Choate et al. | 364/900 X |
| 4,051,354 | 9/1977 | Choate | 364/900 X |
| 4,380,066 | 4/1983 | Spencer | 364/900 |
| 4,426,688 | 1/1984 | Moxley | 365/200 |

Primary Examiner—Raulfe B. Zache
Attorney, Agent, or Firm—Faith F. Driscoll; Nicholas Prasinos

[57] ABSTRACT

A remapping method and apparatus is employed by a memory controller system which includes a microprocessing section which couples to a memory section. The memory section includes a partially good bulk random access memory constructed from a plurality of bit wide chips containing a predefined small number of row or column faults randomly distributed. System columns of chips are organized into a plurality of groups or slices, each of which provide a different predetermined portion of the locations within the partially good bulk memory. A defective-free memory having substantially less capacity is similarly organized. Both memories couple to a static memory which is remapped under the control of the microprocessing section. Prior to remapping, the microprocessing section generates a "slice bit map" indicating the results of testing successive bit groups/slices within the bulk memory locations. Thereafter, the microprocessor section interprets the "slice bit map" and assigns column addresses in the static memory locations designating locations within the defect-free memory. The assignment is carried out in a predetermined manner according to fault category to maximize the use of all of the groups of bit locations within each defect free memory location thereby making storage available for remapping new faults.

31 Claims, 28 Drawing Figures (sheet 1 of 2)

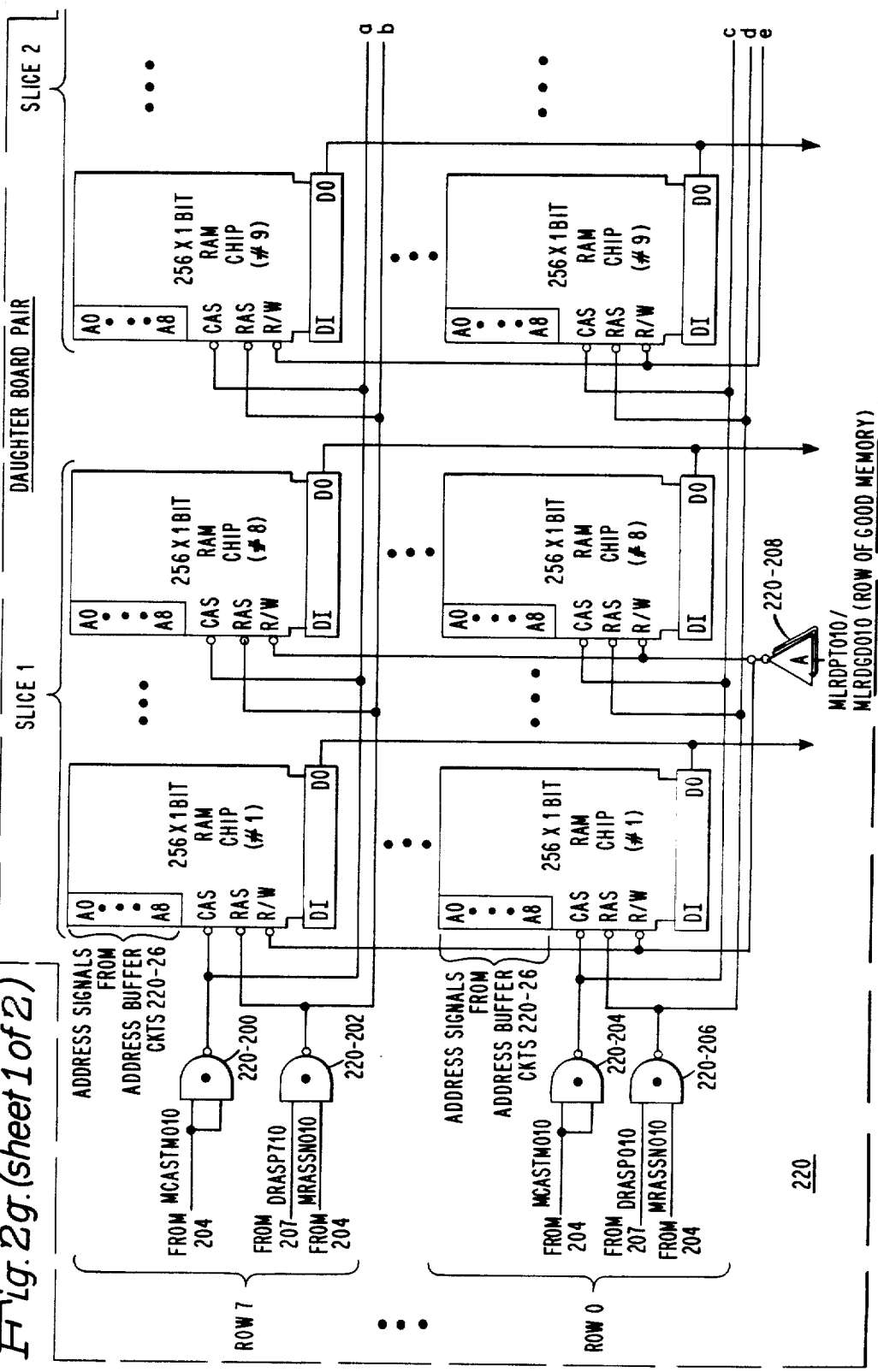
Fig. 2g. (sheet 1 of 2)

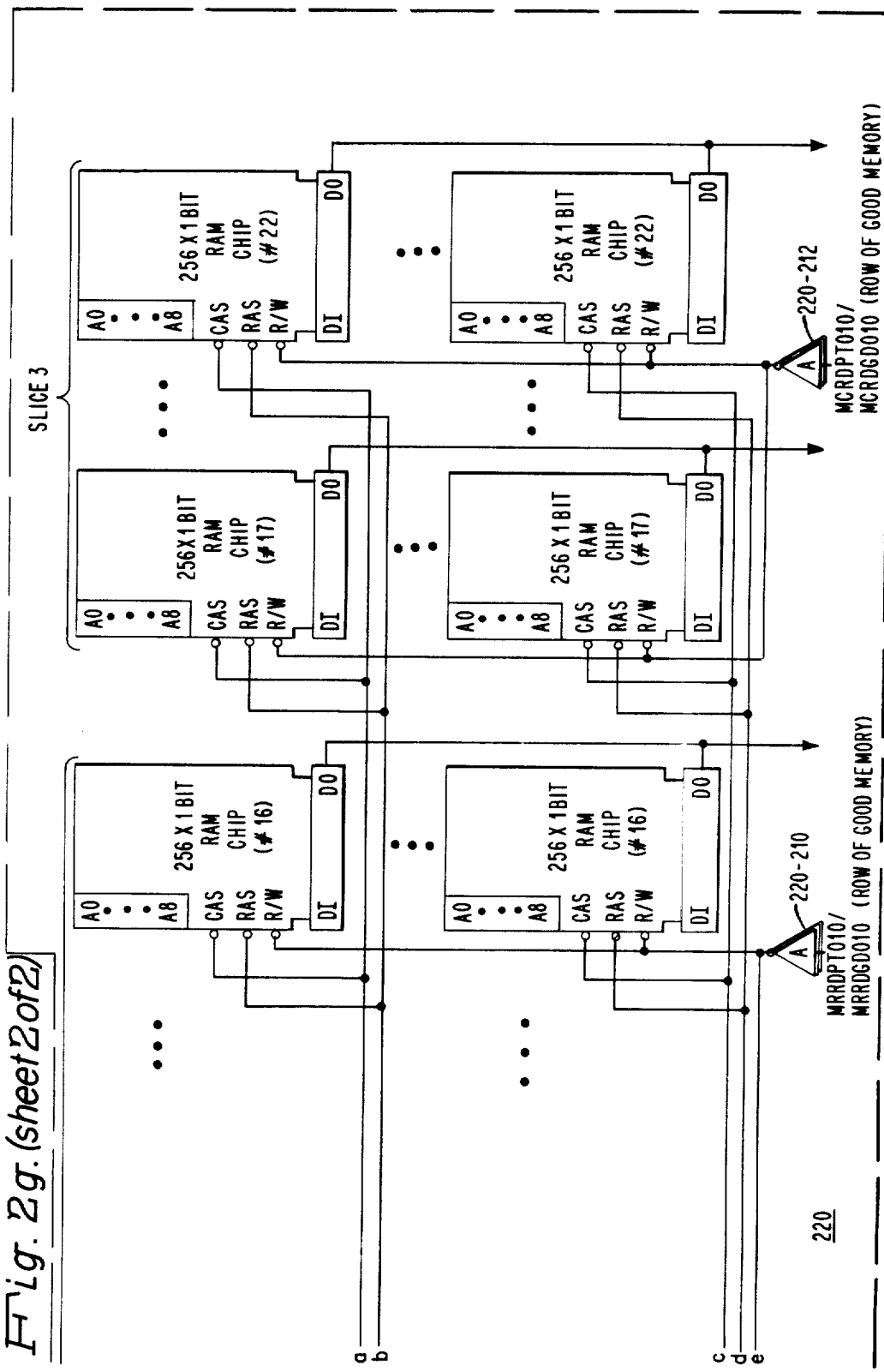
Fig. 2g. (sheet 2 of 2)

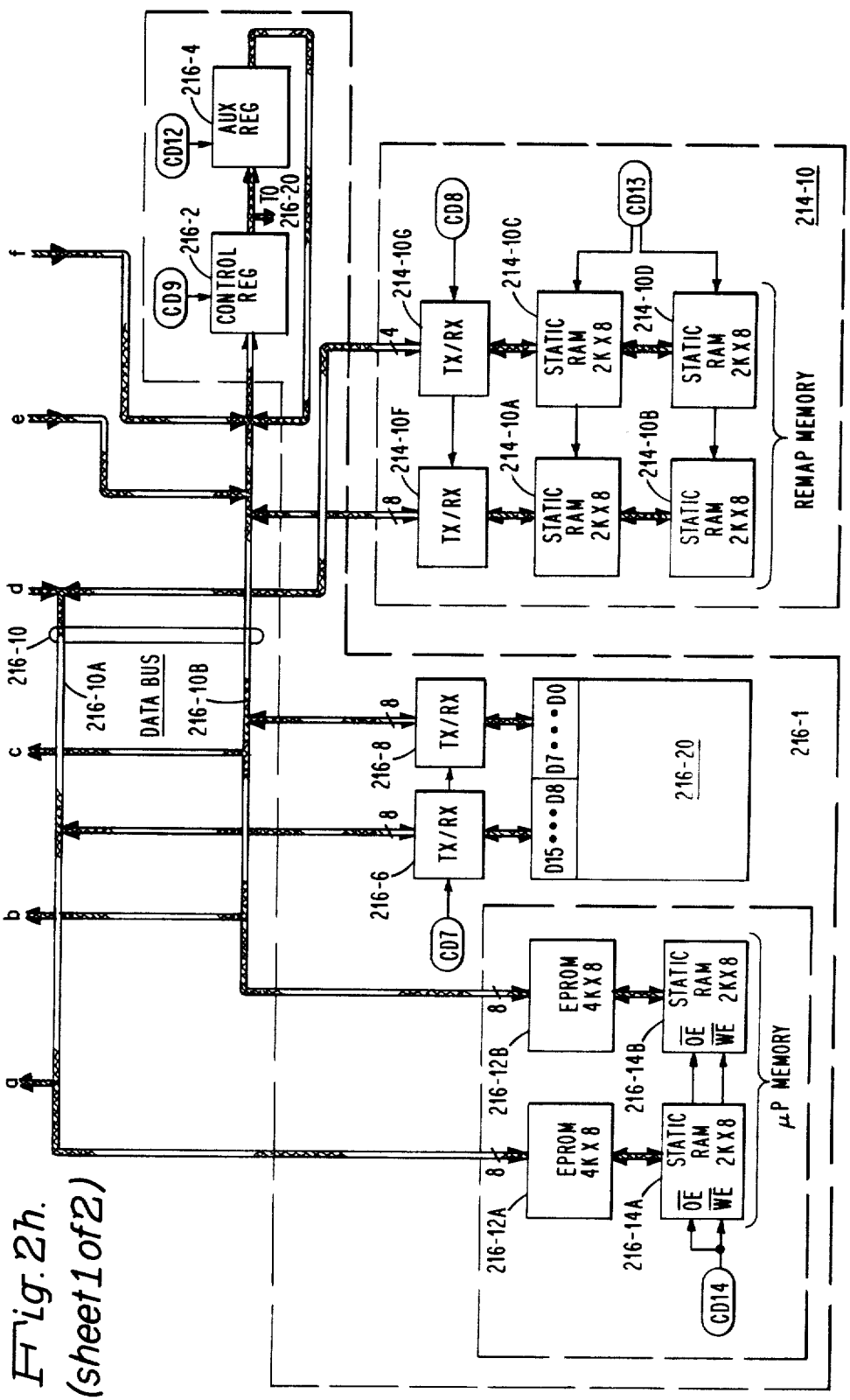
Fig. 2h. (sheet 1 of 2)

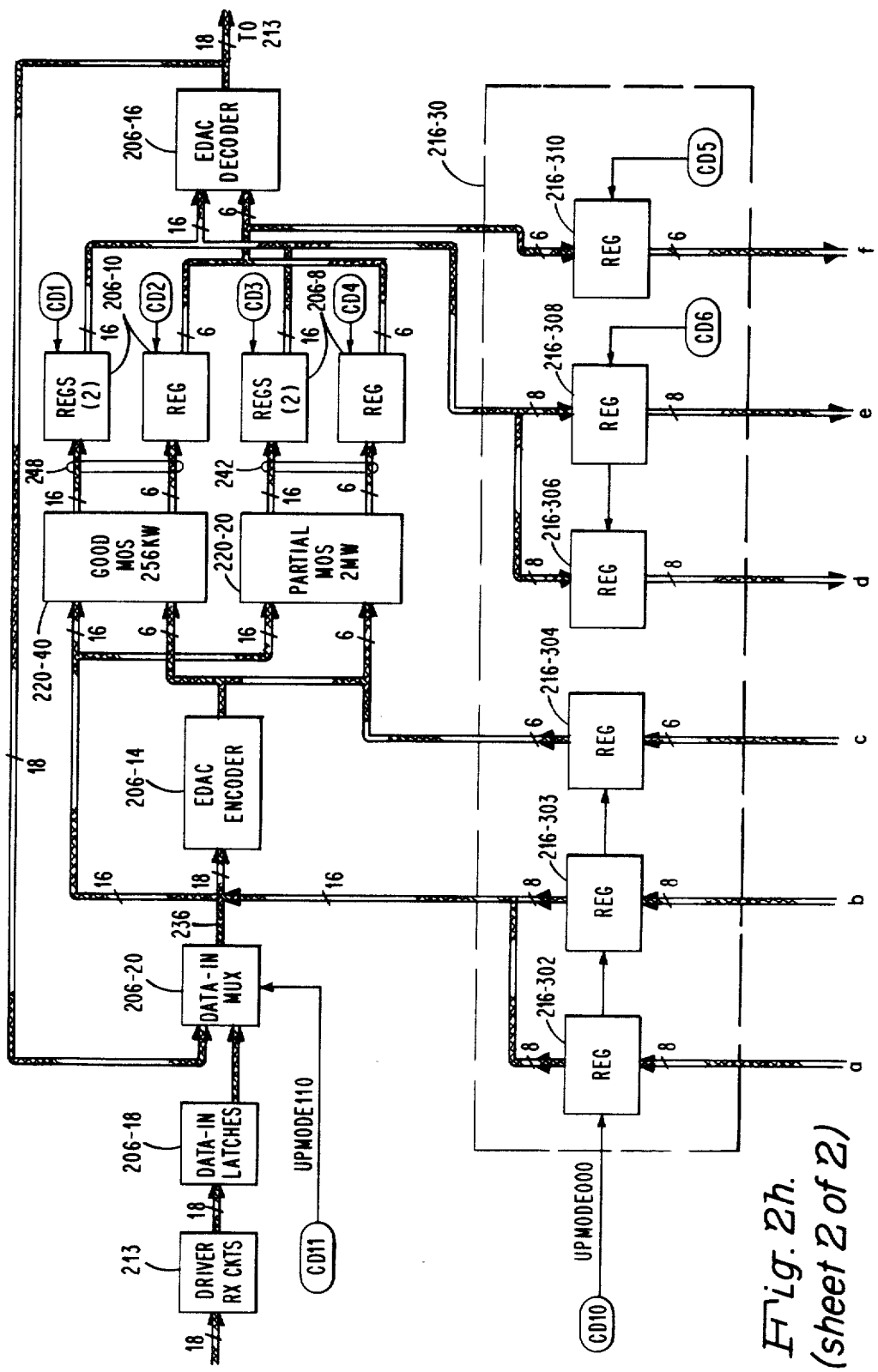
Fig. 2h. (sheet 2 of 2)

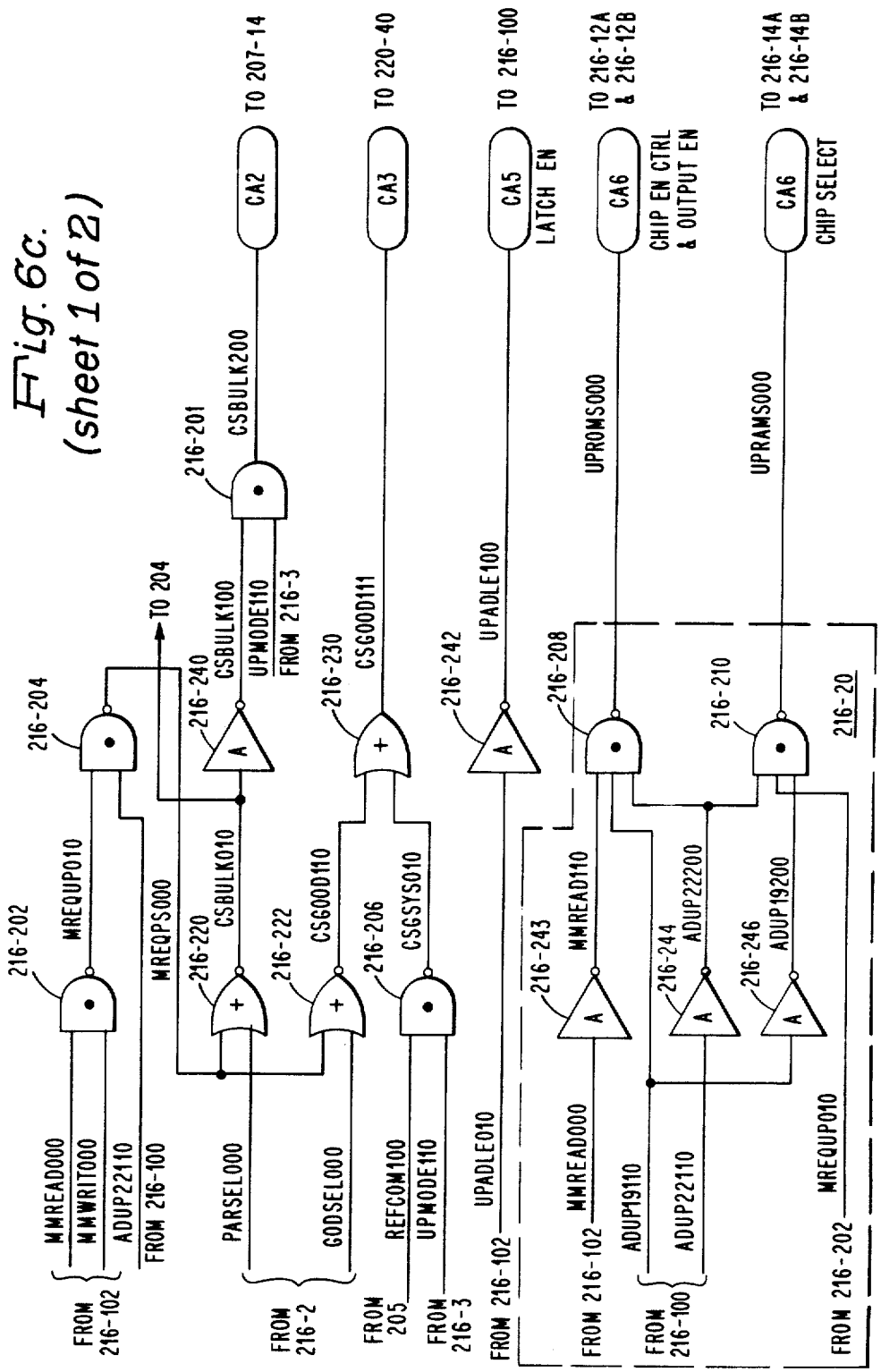
Fig. 6c. (sheet 1 of 2)

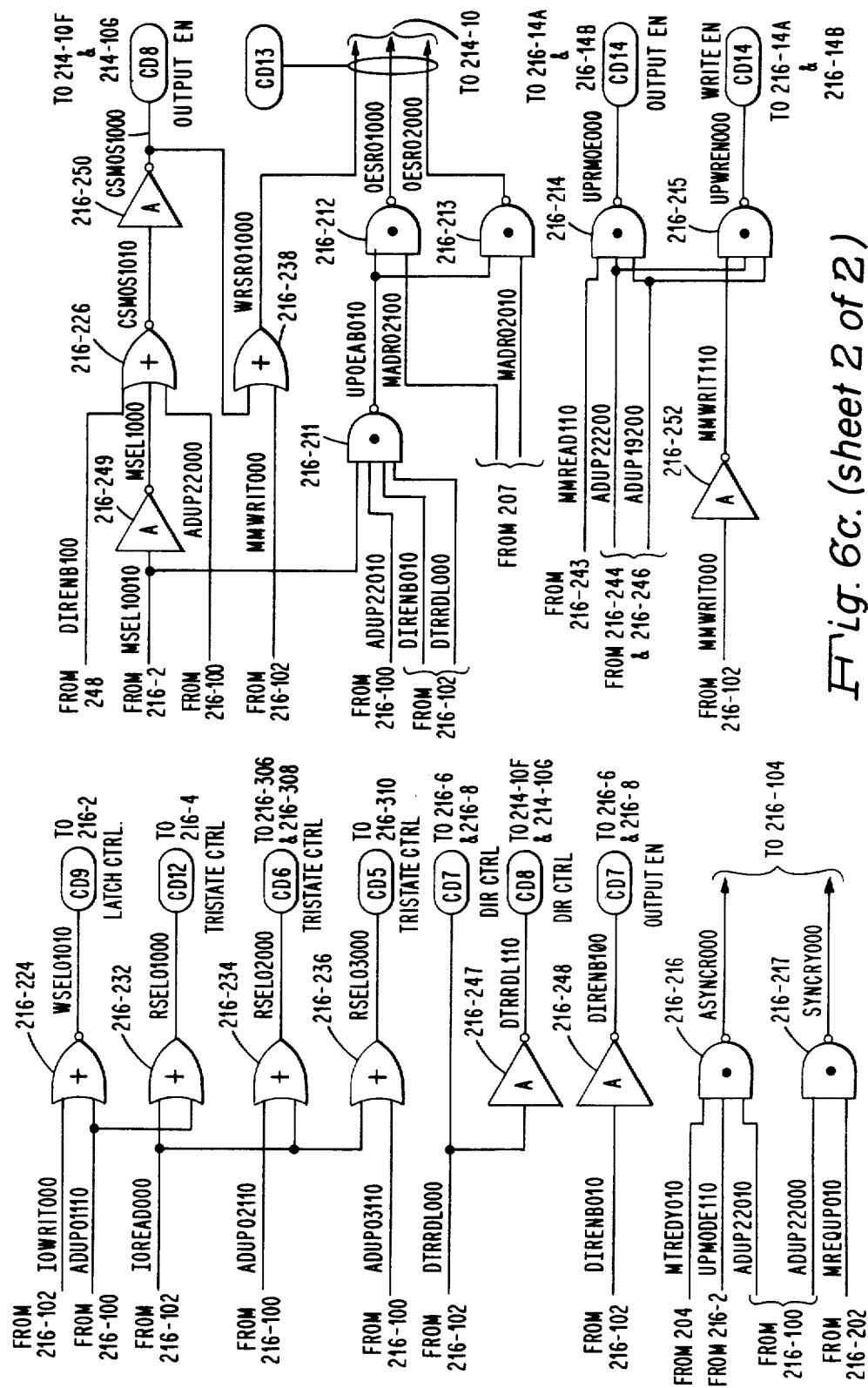
Fig. 6c. (sheet 2 of 2)

Fig. 7b1.

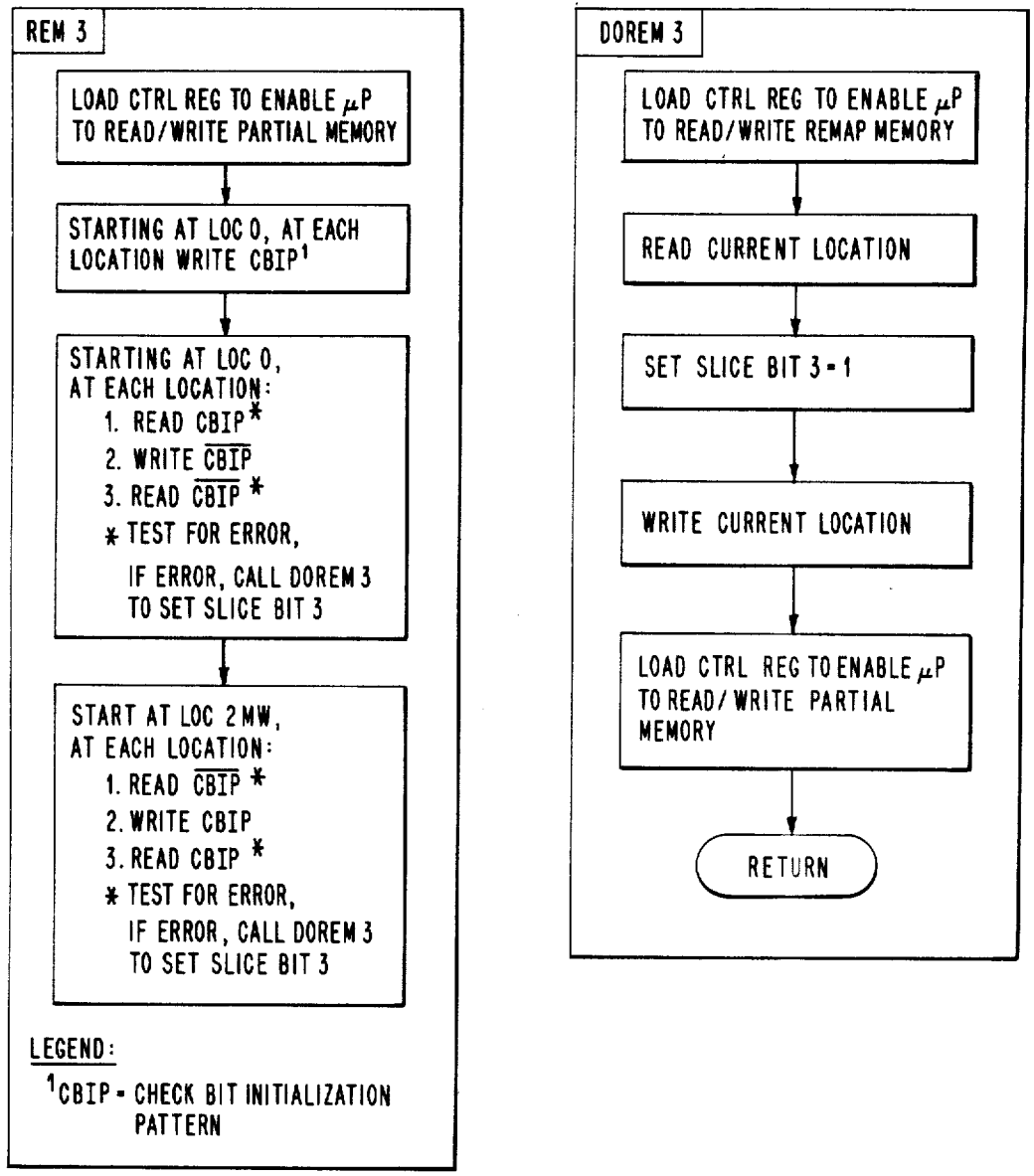
Fig. 7c1.

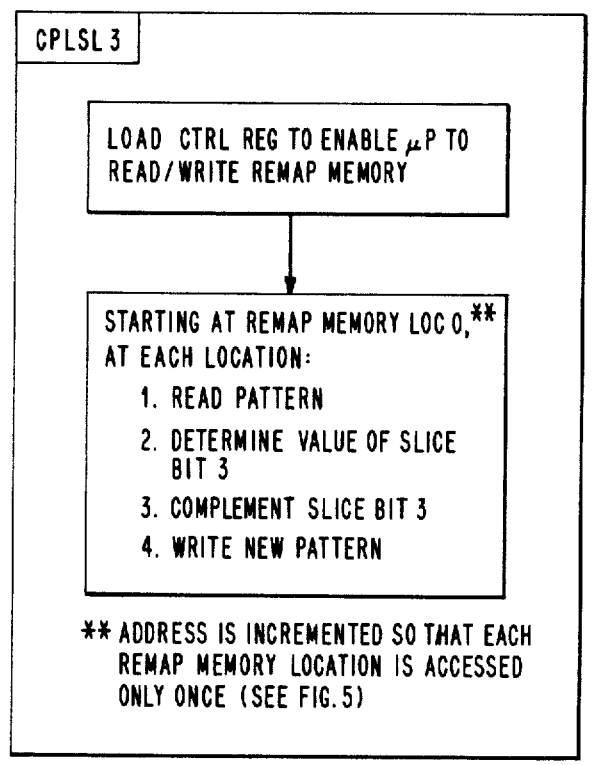
Fig. 7c2.

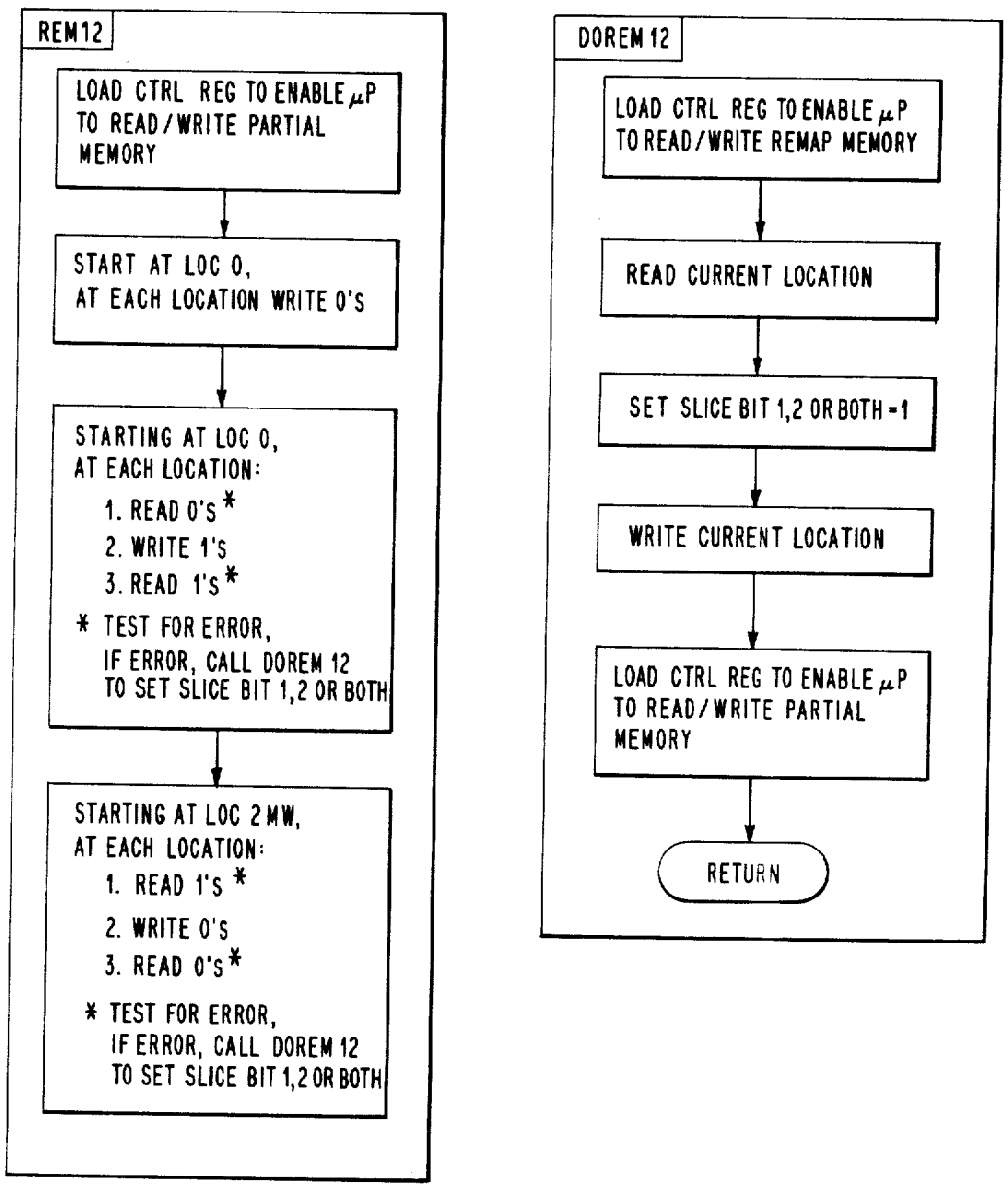
Fig. 7c3.

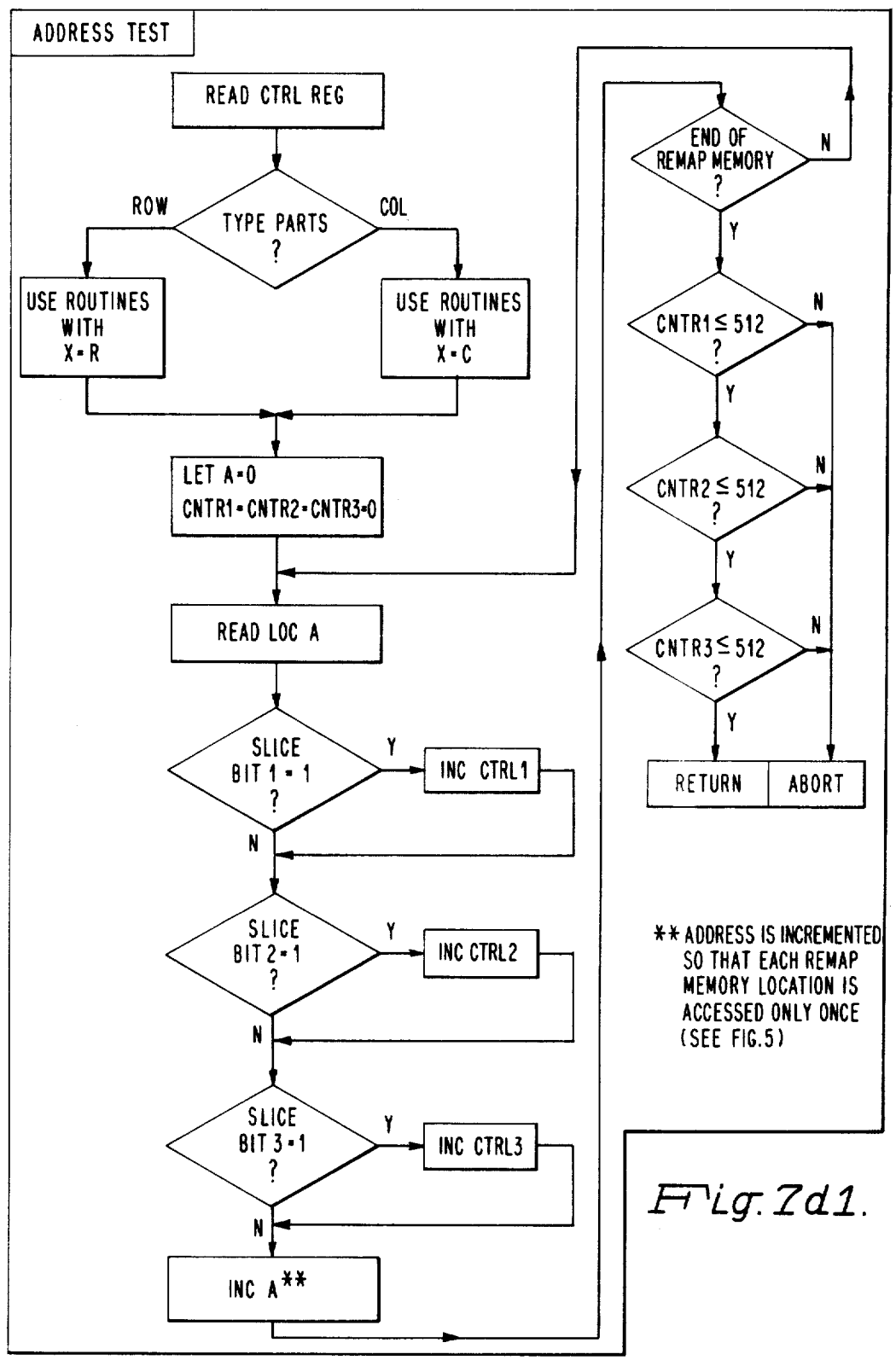

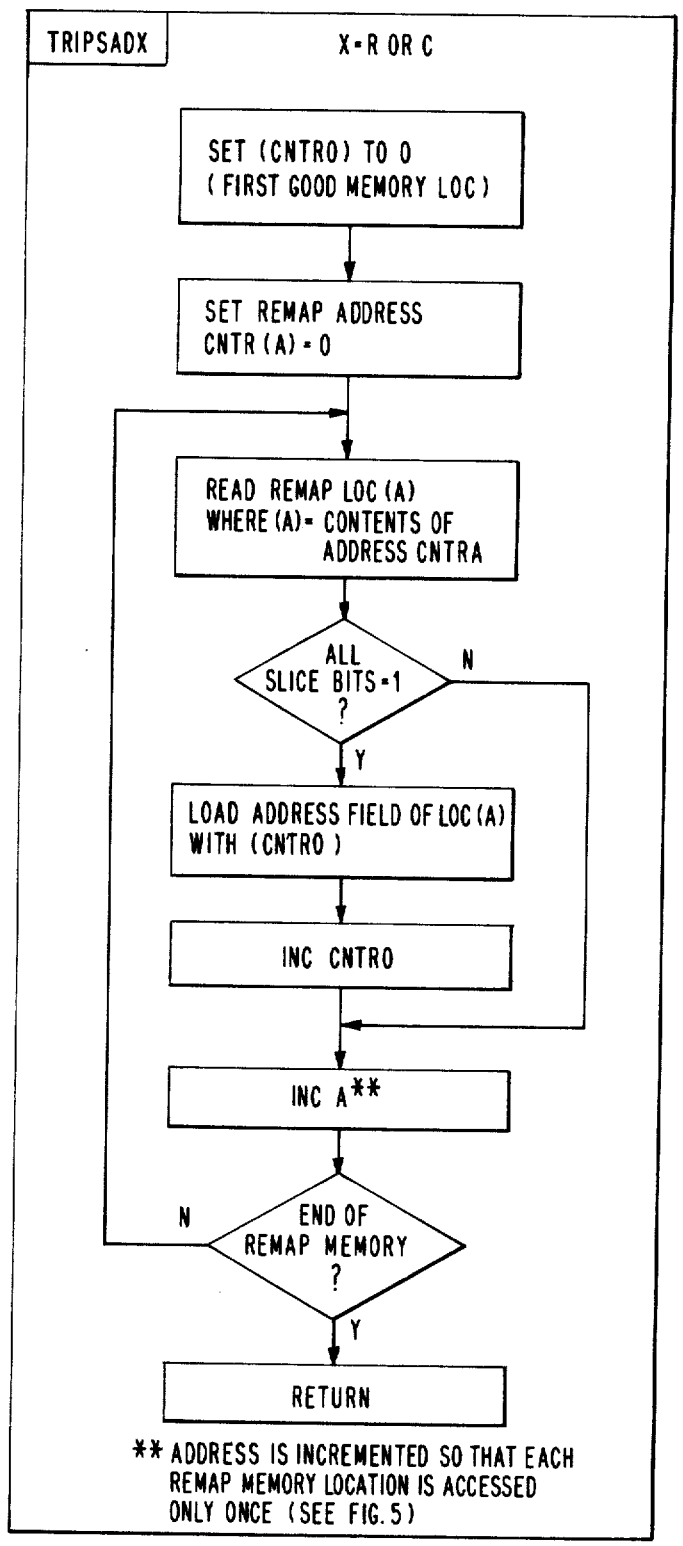
Fig. 7d2.

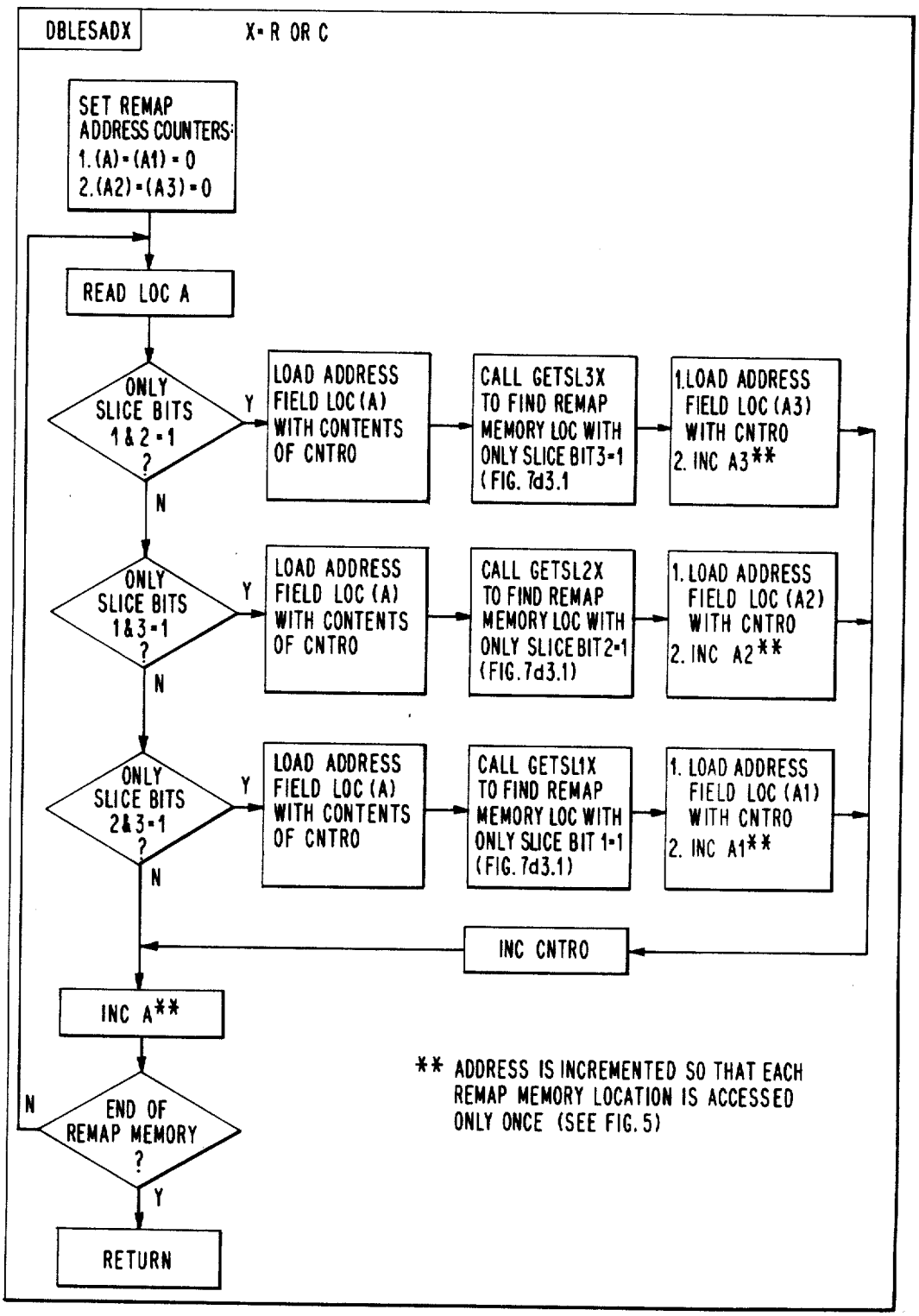
Fig. 7d3.

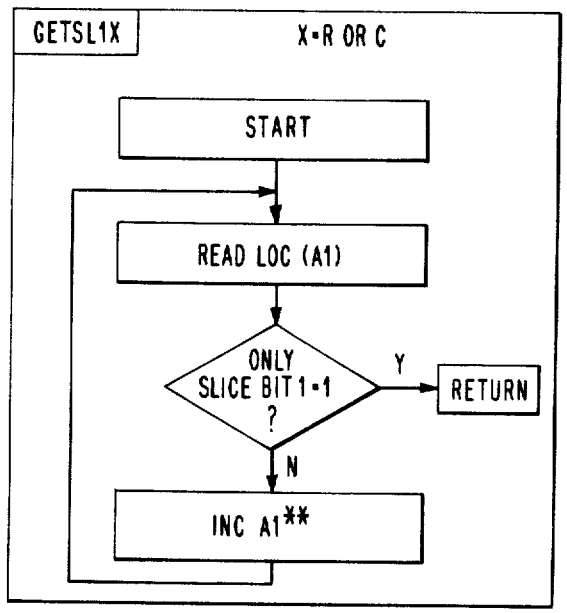
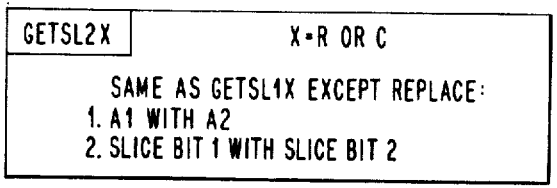
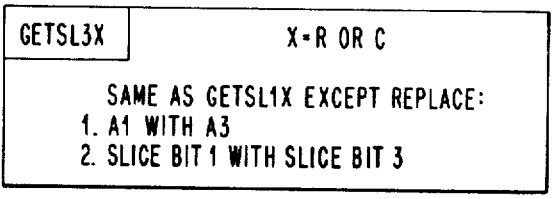
** ADDRESS IS INCREMENTED SO THAT EACH REMAP MEMORY LOCATION IS ACCESSED ONLY ONCE (SEE FIG. 5)
Fig. 7d3.1

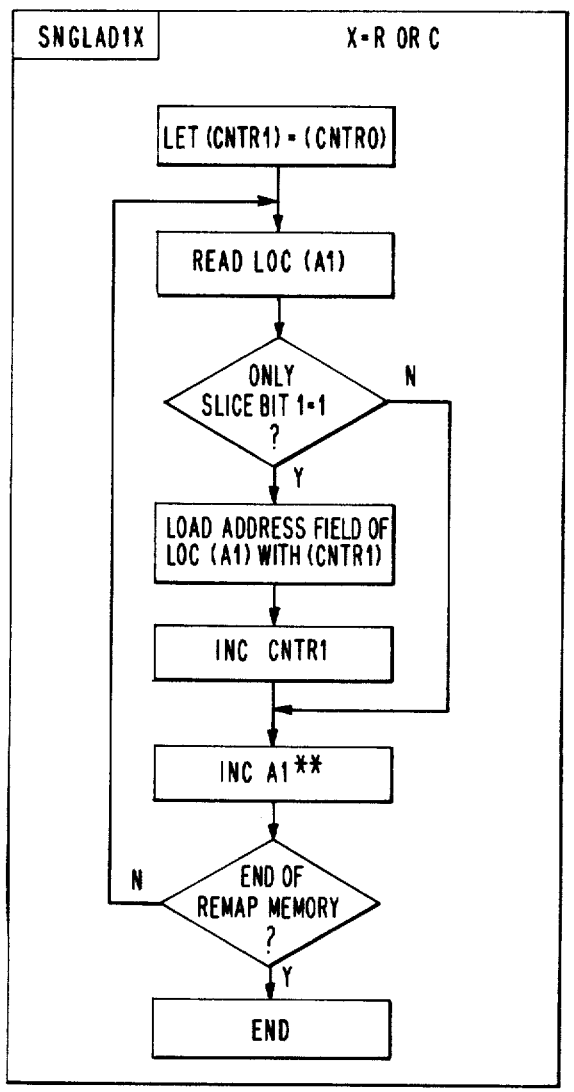
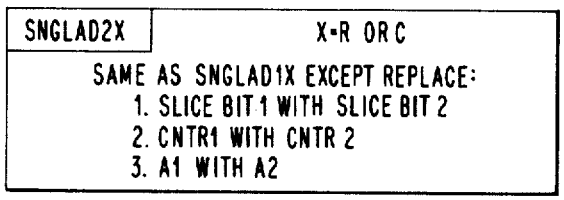
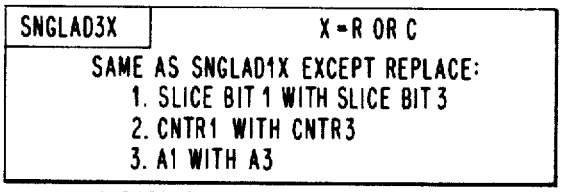
Fig. 7d4.
** ADDRESS IS INCREMENTED SO THAT EACH REMAP MEMORY LOCATION IS ACCESSED ONLY ONCE (SEE FIG. 5)

REMAP METHOD AND APPARATUS FOR A MEMORY SYSTEM WHICH USES PARTIALLY GOOD MEMORY DEVICES

RELATED PATENT APPLICATIONS

1. "Partial Defective Chip Memory Support System", invented by Chester M. Nibby, Jr., Reeni Goldin and Timothy A. Andrews, Ser. No. 06/450,846, filed on even date with this application and assigned to the same assignee as named herein.

BACKGROUND OF THE INVENTION

1. Field of Use

This invention relates to semiconductor memories and more particularly to partially defective random access memories (RAMs).

2. Prior Art

For a number of years, different techniques have been employed which use memories with known defects. Early techniques involved the use of content addressable memories for locating the locations containing bad bits within the memory and enabling its replacement with good locations from another memory.

To reduce cost and speed up memory operations, one scheme disclosed in U.S. Pat. No. 3,434,116 circumvented bad memory cells of a bulk memory using replacement and read only memories having very small storage. The arrangement divided the word lines of the bulk memory into a large number of subword cell groups and substituting alternate subgroups in a replacement memory.

With advances in memory technology, techniques have been implemented that use memory components with known defects in the manufacture of memory systems. One technique involved the use of partially good memory chips/components in which at least three quarters of the memory array is known to be good. In this case, four different types of partially good chips are mixed with each type having one of its four quadrants containing defects. This technique is described in the article "The Case For Using Partially-Good Memory Devices" by Robert H. F. Lloyd, published in the April, 1977 issue of Computer Design.

Other techniques have employed partially good chips in which at least one-half of the memory array is known to be good. In this case, the memory system has to mix the appropriate amount of devices having good left and right halves to make a good working memory.

In order to produce partially good memory components with very high percentages of good cells, recently bulk devices containing at least two manufacturing defects in the array area have been proposed for use by one semiconductor manufacturer. The devices are of two types. A first type (type R) can contain up to a predetermined small number (e.g. 4,8) randomly distributed defective rows. The second type (type C) can contain up to the same predetermine number of defective columns and/or cells. Using this criteria of bulk device, a 64K memory component can contain 98 percent good cells.

The above criteria makes it possible to reduce the amount of additional storage for providing a good memory. The row or column defects within such memory components are random. Normally, in the failures in the row dimension are caused by metal opens resulting in less than a row being defective or by metal shorts resulting in two adjacent rows being shorted together. Therefore, in the case of two metal shorts/defects, there would be a loss of two rows per short or a total of four defective rows in a device. The majority of column failures result from an imbalance in the sense amplifier. This removes one column or results in one defective column. In the column dimension, there can be up to four defective sense amplifiers. A third type of defect that affects a bit could be dirt, a lattice defect or a mask defect. This type of failure could produce anywhere from one to four bit clusters, not necessarily near one another.

The article "Partial RAMs can fill today's memory boards" by Jerry Donaldson published in the Jan. 17, 1980 issue of Electronics describes a memory constructed from these types of partially good memory components. In the memory described, bit remapping hardware is employed and in operation when an address is given to the memory board, board logic included therein compares to those in a lookup table. When the address is there, an extra RAM is enabled. Data is written into or read from a row or column in the extra RAM corresponding to the address of a failing row or column in the partial bulk memory.

Another proposed scheme which utilizes bit mapping hardware requires that only double bit errors be remapped and that error detection and correction logic circuits included within the memory be used to correct single bit errors.

It has been found that the above schemes require a considerable amount of support logic circuits, such as bit remapping hardware. Moreover, such remapping hardware normally includes programmable read only memories. The result is that it becomes difficult and uneconomical to use a memory constructed from partially good chips within a conventional memory controller system. Also, in the case of additional faults occurring in the field, such schemes require the replacement of the memory by field personnel. This in turn results in increased maintenance costs and reduced reliability.

A further disadvantage relates to decreases in fault tolerance produced by alpha particles or soft errors which can create double errors from single error faults.

Accordingly, it is a primary object of the present invention to provide an intelligent memory system constructed from partially good memory components which have few numbers of random defective rows or columns which can be maintained with a minimum of effort.

It is a further object of the present invention to provide a memory controller system constructed from partially good memory components which has high reliability.

SUMMARY OF THE INVENTION

The above objects and advantages of the present invention are achieved in a preferred embodiment of the memory controller system which includes the remapping method and apparatus of the present invention. The embodiment includes a microprocessing section which operatively couples to a memory section. The memory section includes a partially good memory constructed from random access memory (RAM) chips, each having a predetermined small number of row or column faults distributed randomly. The chips are organized into numbers of system rows and columns. The system columns of chips are organized into groups or slices wherein each group provides one portion of the total number of word locations in the memory. The memory system includes an addressable defect free memory constructed from RAM chips organized into at least one system row and the same number of system columns as the partially good memory.

The good or defect free memory columns of chips are organized into groups for providing assigned predetermined portions of up to the total number of memory word locations. Both memories couple to an addressable static random access remap memory having a small number of locations which store column addresses associated with locations in the good memory and slice bit codes specifying the operational status of corresponding groups of word locations within both memories. The static remap memory is remapped under the control of the microprocessing section when the system is powered up.

Prior to remapping, the microprocessing section verifies that the different memories within the system are operational. During such verification, it generates a "slice bit map" indicating the results of testing successive bit groups/slices within the partially defective memory. Also, the microprocessing section is connected to receive the uncorrected data from memory. This enables it to test partially defective memory locations independently of the EDAC apparatus included within the memory system. Therefore, all faults within the partial memory are indicated within the "slice bit map". This ensures the memory's resistance against soft errors or alpha particles.

Thereafter, the microprocessor section interprets the "slice bit map" and assigns successive column addresses within the good memory. The assignment of good memory locations is carried out in a predetermined manner according to fault category to maximize the use of all of the groups of bit locations within each good memory location thereby making storage available for remapping new faults.

In the preferred embodiment, each location of the static remap memory includes a slice bit field portion and an address field portion. The slice bit field includes a plurality of bit locations corresponding in number to the number of groups or slices of bits. During verification, the microprocessing section sets each bit location within a slice bit field to a predetermined state (i.e., binary ONE) when the group or slice of bits associated therewith contains a row or column fault. By altering the sequencing of addressing partial memory locations, the microprocessing section can generate "a slice bit map" for a partial memory constructed from chips containing all row faults or all column faults.

According to the preferred embodiment of the present invention, the microprocessing section assigns the address field portions of the static remap memory according to the category of fault indicated by the slice bit field. For example, each all ONES slice bit pattern which in the case of a 3-bit slice bit field corresponds to a triple fault or can be generated by combining a double fault and matching type of single fault is assigned a single next available good memory address. In the first instance, the assigned good memory address is stored once while in the second instance, it is stored twice. Also, the microprocessing section assigns a single next available address to numbers of different matching individual single faults which can generate an all ONES pattern. Here, the assigned address is stored three times. This is done unit all the faults have been remaped. By assigning faults in this manner, the good memory locations are kept to a minimum making good memory locations available for later occurring faults.

It will be appreciated that the microprocessing section, in addition to performing verification, testing and remap operations, can also be used to perform operations normally associated with memories such as memory management and the like. When so utilized, the added cost in circuits to carry out the dynamic remapping operations of the present invention becomes insignificant. Since the microprocessing section of the preferred embodiment is constructed from standard chips, this reduces cost. More importantly, the same circuits used during the initial remapping operation can be used as required during power up or upon command to repeat the remapping operation taking into account newly occurring failures. This increases the memory system's reliability over conventional memory systems.

The novel features which are believed to be characteristic of the invention both as to its organization and method of operation together with further objects and advantages will be better understood from the following description when considered in connection with the accompanying drawings. It is to be expressly understood, however, that each of the drawings are given for the purpose of illustration and description only and are not intended as a definition of the limits of the present invention.

BRIEF DESCRIPTION OF THE DRAWINGS

FIGS. 2a through 2h show in greater detail different sections of FIG. 1.

FIGS. 6a through 6c show in greater detail the circuits of section 216.

FIGS. 7a, 7b, 7b1, 7c, 7c1, 7c2, 7c3 through 7d, 7d1, 7d2, 7d3, 7d3.1, 7d4 are flow diagrams used in explaining the operation of the preferred embodiment of the present invention.

GENERAL DESCRIPTION OF PREFERRED EMBODIMENT

Figure 1:
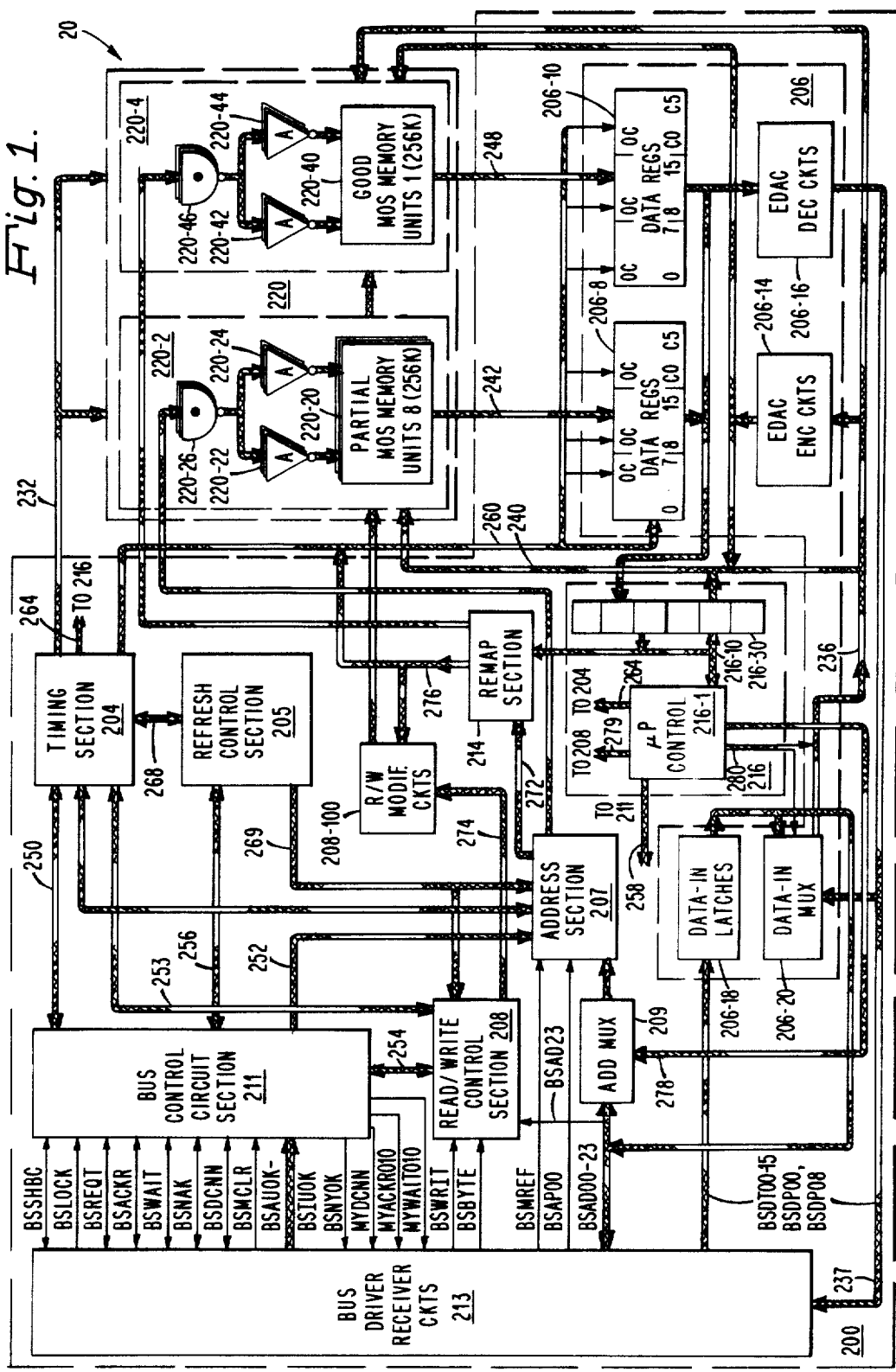
FIG. 1 shows in block diagram form a preferred embodiment of the memory system of the present invention.

FIG. 1 illustrates in block diagram form a preferred emmbodiment of a memory system constructed using the principles of the present invention. The memory system 20 connects to a system bus interface which includes the following lines: address lines (BSAD00-23, BSADP00), data lines (BSDT00-15, BSDP00, BSDP08, control lines (BSMREF, BSWRIT, BSBYTE, BSLOCK, BSSHBC and BSMCLR), handshake/timing lines (BSREQT, BSDCNN, BSACKR, BSWAIT, BSNAKR) and tie breaking network lines (BSAUOK-BSIUOK, BSMYOK). These lines will only be discussed herein to the extent necessary for an understanding of the operational principles of the present invention. However, for a more detailed description of the memory interface lines, reference may be made to U.S. Pat. No. 4,319,324.

Memory Section 220

As shown, memory system 20 includes a memory section 220 and a microprogrammed controlled controller section 200. The controller section 200 controls access to the 4 megabyte memory section 220 which includes a partial memory section 220-2 and a good memory section 220-4.

Partial Memory Section 220-2

The partial memory section 220-2 includes a bulk memory device 220-20 which has eight system rows of 256K RAM chips. According to the present invention, the chips of all system rows of device 220-20 are organized into three groups or slices which reduces significantly the amount of support circuits required as explained herein. The first two groups of 256K RAM chips each contain eight chips while the third group contains six chips. Collectively, the three groups provide two megawords of data storage, each word being 22 bits in length.

According to the preferred embodiment, each 256K chip can have up to eight randomly distributed row or eight column defects. This criteria is established by subjecting the chips to conventional testing as discussed in the Donaldson article. Normally, this function will be carried out by the semiconductor manufacturer. By using 256K RAM chips with the same type of defect (i.e., up to eight row or column defects) for the construction of device 220-20, chip yields can be increased substantially, lowering memory costs without any reduction in memory reliability as discussed herein.

The 256K RAM chips are mounted on two daughter boards as discussed herein, each daughter board having four system rows of chips. Each daughter board contains circuits for connecting memory section 220-2 to the different sections of the controller 200. More specifically, each board includes address buffer circuits which correspond to NAND gates 220-26 and inverter circuits 220-22 and 220-24. These circuits are connected to receive row, column and refresh address signals via a path 230 from an address section 207 of controller section 200. Also, each daughter board includes gating circuits for receiving decode signals from section 207 via path 238, timing signals via path 232 from section 204 and read/write control signals via a path 234 from read/write modification section 208-100 in accordance with the present invention. Input data signals are applied to each daughter board from either 206 or section 216 via paths 236 and 240, respectively. Output data signals from each daughter board are applied to section 206 via a path 242.

Good Memory Section 220-4

As seen from FIG. 1, the good memory section 220-4 includes a good memory device 220-40 which has a single system row of 256K RAM chips. According to the present invention, the chips of memory device 220-40 are organized into three groups or slices as the 256K RAM chips of device 220-20.

The 265K RAM chips are mounted on a single daughter board. The daughter board contains circuits for connecting memory section 220-4 to the different sections of controller 200. More specifically, the daughter board includes address buffer circuits which correspond to NAND gates 220-46 and inverter circuits 220-42 and 220-44. According to the present invention, these circuits are connected to receive row, column and refresh address signals via a path 224 from a remap section 214.

Also, the daughter board includes gating circuits for receiving decode signals from section 207, timing signals via path 232 from section 204, and read/write control signals via path 234 from section 208. Similar to memory section 220-2, input data signals are applied to the daughter board of good memory 220-4 from either section 206 or section 216 via paths 236 and 240, respectively. Output data signals from the daughter board are applied section 206 via a path 248.

Controller Section 200

The controller section 200 includes those circuits required to generate memory timing signals, perform memory remap operations, perform refresh operations, data transfer operations, address distribution and decoding operations and bus interface operations. Such circuits are included as part of the different sections of FIG. 1.

The sections include a timing section 204, a refresh control section 205, a data control section 206, an address section 207, a read/write control section 208, a read/write modification section 208-100 a bus control circuit section 211, a bus driver/receiver circuit section 213, a remap section 214 and a microprocessing section 216.

The bus control section 211 includes the logic circuits which generate signals for generating and accepting bus cycle requests for single word fetch operations. As seen from FIG. 1, these circuits as well as the circuits of other sections connect to the driver/receiver circuits of section 213, conventional in design. The section 211 includes the tie breaking network circuits which resolve request priority on the basis of the memory system's physical position on the bus. It transmits or transmits and receives signals to and from sections 204, 205, 207, 208, and 216 via paths 250, 252, 254, 256 and 258.

The timing section 204 includes circuits which generate the required sequence of timing signals for memory read and write cycles of operation. As seen from FIG. 1, this section transmits and/or receives signals to and from sections 205, 206, 207, 208, 211 and 216 via paths 258, 260, 262, 253, 250 and 264 respectively.

The address section 207 includes circuits which decode, generate and distribute address signals required for initialization and read/write memory selection. That is, section 207 provides row, column and refresh address signals to memory section 220-2 via path 230 as mentioned previously. Additionally, the same row, column and refresh address signals are applied to remap section 214 via a path 272, along with timing signals from section 204 from path 262. Section 207 applies rows address decode signals to memory section 220-2 via path 238.

Section 207 receives address signals from address lines BSAD08-BSAD23 and address lines BSAD00-BSAD07 and BSAP00 via address multiplexer 209, and from section 216 via address multiplexer 209 and path 278, in addition to the memory reference control signal from the BSMREF line. Additionally, section 207 receives control and timing signals from section 204 via path 262.

The read/write control section 208 includes register and control logic circuits, conventional in design. The register circuits receive and store signals corresponding to the states of the BSWRIT and BSBYTE control lines and the address line BSAD23. The section 208 receives input signals from sections 204, 205, 211 and via paths 252, 269 and 254, respectively. The control circuits decode the signals from register circuits and generate signals which are applied to sections 204, 208-100 and 211 via paths 253, 274 and 256, respectively. These signals are used to indicate the type of operation the system has been directed to perform, such as a read, write or a read followed by a write cycle of operation (i.e., for a byte command).

The read/write modification section 208-100 in accordance with the teachings of the present invention generates six read/write control signals, three of which are applied to the corresponding one of three groups of chips of partial, and three of which are applied to one of three groups of good memory devices 220-20 and 220-40 via path 234. The first, second and third groups of chips of devices 220-20 and 220-40 correspond to left byte bits 1-8, right byte bits 9-16 and memory check bits 17-22. Section 208-100 receives a read command signal from section 208 via path 274 and a set of slice control signals from remap section 214 via path 276.

The refresh section 205 includes the circuits for periodically refreshing the contents of memory. Section 205 receives timing and control signals from sections 204 and 211 via paths 258 and 256, respectively. Section 205 provides control signals to sections 204, 207, 208 and 211 via paths 258, 269 and 256, respectively.

The data control section 206 includes data-in latches 206-18, a pair of tristate operand data registers 206-8 and 206-10 and a tristate data-in multiplexer circuit 206-20 with associated control circuits which enable data to be written from section 213 or from the memory devices 220-20 and 220-40 of section 220. For example, during a read cycle of operation, operand or instruction signals are read out from memory devices 220-20 and 220-40 into the output registers 206-8 and 206-10 and applied to the section 213 via path 237. During a write cycle of operation, the byte operand signals are loaded into the data-in latches of block 206-18 from section 213, transferred via multiplexer 206-20 and written into section 220 memories.

The data control section 206 includes an error detection and correction circuits (EDAC) wherein each word contains 16 data bits and six check bits which are used to detect and correct single bit errors in the data words and detect and signal without correction, double bit errors in the data word. The EDAC circuits include EDAC encoder circuits 206-14 and EDAC decoder circuits 206-16. These circuits may take the form of those circuits disclosed in U.S. Pat. No. 4,072,853 which issued Feb. 7, 1978.

Data section 206 enables the return of identification information received from the data lines BSDT00-15 and data-in latches 206-18 via the address lines BSAD08-23.

Remap section 214 includes a remap memory and associated tristate register circuits which generate the necessary row, column and refresh address signals to be applied to good memory section 220-4 via path 244. Additionally, section 214 provides first, second and third complementary slice control signals which are applied to read/write modification section 208-100 via path 276 and to data output registers 206-8 and 206-10 via path 260.

As explained herein, the remap memory is constructed from 256K RAM chips. Since each chip of partial memory device 220-20 can have a maximum of eight defects randomly distributed, 64 good rows or columns are required for each 8-bit slice or group. For eight system rows of partially defective 265K RAM chips, 512 good rows or good columns are required (64×8). Since each good 256K RAM chip is internally organized into 512 rows and 512 columns, mapping can be carried out by using all of the rows and columns within a good 256K RAM chip. It will be appreciated that if the criteria was less than eight, it would be possible to utilize a chip having less good rows and good columns such as a "half good" chip. The width of the remap memory is 12 bits which is large enough to provide the desired nine address bits for addressing good memory section 220-4 and the three slice bit control signals.

The preferred embodiment of the controller section 200 includes a microprocessor section 216. In addition to the different types of memory operations which can be performed under microprogram control, section 216 is allocated the function of performing the dynamic mapping involving remap section 214. Such mapping takes place upon power up and leaves the memory system 20 in an initialized state.

As seen from FIG. 1, section 216 includes a microprocessor control unit 216-1 and the plurality of tristate processor data registers of block 216-100. Microprocessor control unit 216-1 includes a central processing unit (CPU) which has a microprocessor memory section, a clock generator, a bus controller and bus transceivers. As discussed herein, these units can be implemented using standard chips manufactured by semiconductor companies, such as Intel Corporation, etc. For example, the CPU can be constructed from an 80286 integrated circuit chip, the clock generator from an 82284 chip, the bus controller from an 82288 chip and transceivers from 74LS245 chips.

The CPU chip of block 216-1 connects through bus transceiver circuits to a split data bus 216-10 which in turn connects to the data registers of block 216-100. Bus 216-10 connects to remap section 214 which enables the CPU of block 216-1 to test and load the remap memory of section 214.

Additionally, the CPU connects into the controller section address lines BSAD00-23 through address multiplexer circuit 209 via path 278. By controlling multiplexer circuit 209, address section 207 receives address signals from either section 213 or microprocessor section 216. Section 216 also provides control signals to section 211 via path 258 for inhibiting access to memory system 20 by a user program during remap operations. Other control signals are provided to read/write control section 208 and timing section 204 via paths 279 and 264, respectively. This enables the CPU to control read/write operations and initiate memory cycles during remap operations.

The CPU of block 216 provides input data to memory via data bus 216-10, the data registers of block 216-100 and encoder 206-14. At the same time, the CPU of block 216-1 inhibits data-in multiplexer 206-20 and encoder 206-14 via path 280. This gives the CPU complete control over the data being furnished to memory section 220.

The CPU of block 216-1 receives data from memory section 220 via bus 216-10 and the data registers of block 216-100. Since for the purposes of remapping, the corrected data is not used, the uncorrected data from memory stored in registers 206-8 and 206-10 is applied to the processor data bus 216-10 along with the check bit signals.

DETAILED DESCRIPTION OF MEMORY SYSTEM 20

Only those sections which are believed necessary to an understanding of the present invention are described herein. For further information regarding the remaining sections, reference may be made to U.S. Pat. Nos. 4,319,324 and 4,185,323.

Section 204

Figure 2A:
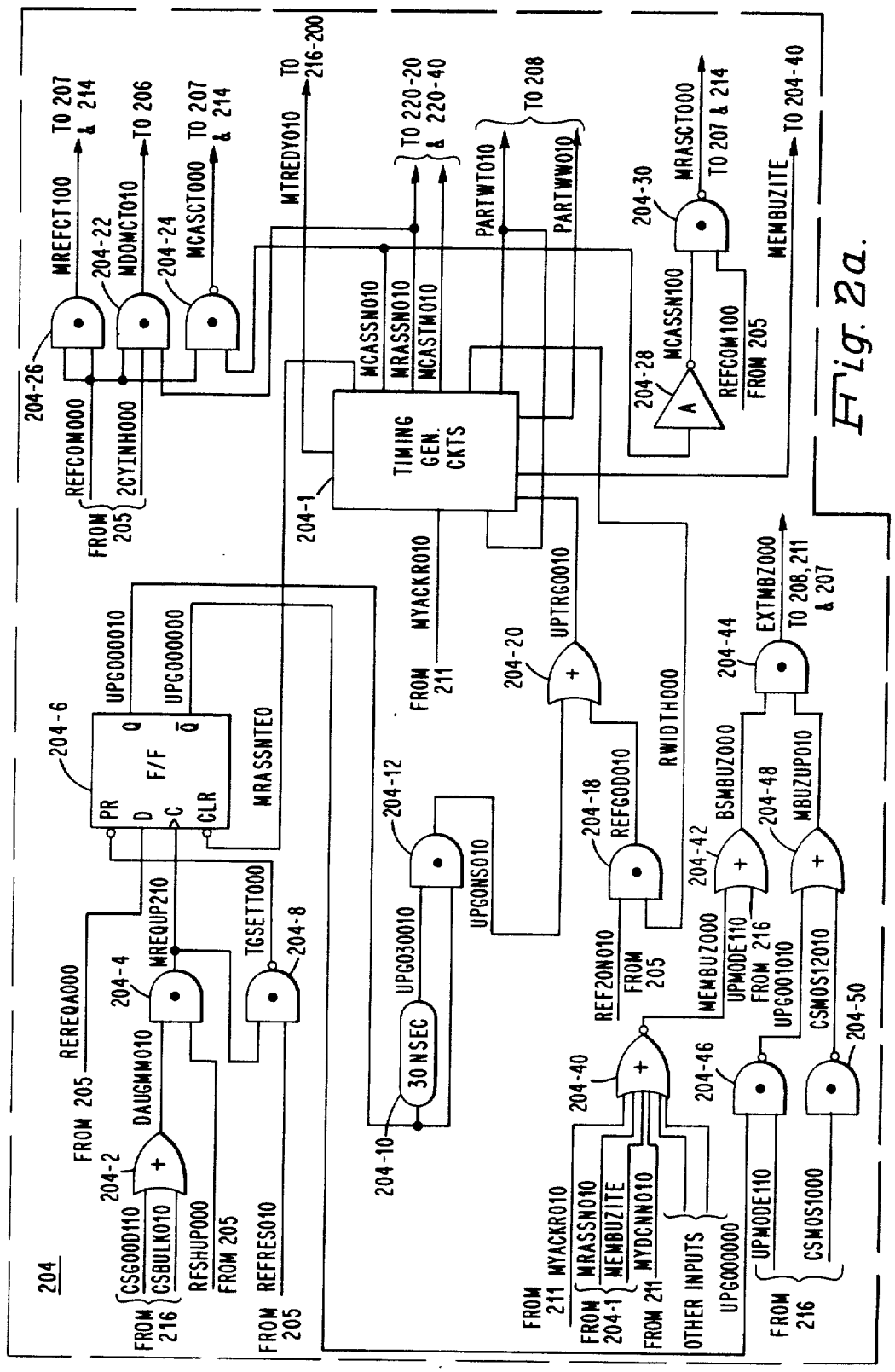

FIG. 2a illustrates in greater detail a portion of the timing circuits of section 204. The circuits shown generate the row and column address strobe signals MRASSN010 and MCATSM010 which are applied to memory devices 220-20 an 220-40. Additionally, the circuits generate timing signals MTREDY010, MDOMCT010, MCASCT000, MRASCT000 and MREFCT100 which are applied to the sections 206, 207, 214 and 216.

As seen from FIG. 2a, the timing generator circuits of block 204-1 generate a sequence of timing signals in response to the signal MYACKR010 from section 211 being switched to a binary ONE. These pulses establish the timing for the remaining sections during a memory cycle of operation.

In a similar fashion, the timing generator circuits of block 204-1 generate a sequence of timing signals in response to signal UPTRG0010 from microprocessor section 216 being switched to a binary ONE.

In greater detail, signals CSGOOD110, CSBULK010 and RFSHUP000, generated by section 216, and refresh signal RFSHUP000 from section 205, are combined in an OR gate 204-2 and an AND gate 204-4 to produce microprocessor memory request signal MREQUP210 which is applied to a clock (C) input terminal of a D-type flip-flop 204-6. In the absence of a refresh request from section 205, signals REREQA000, REFRES010 and RFSHUP000 are a binary ONE, ZERO and ONE, respectively. Therefore, a toggle set signal TGSETT000, applied to a preset (PR) terminal of D-type flip-flop 204-6, generated by a NAND gate 204-8, remains a binary ONE. The result is that signal MREQUP210 switches flip-flop 204-6 to a binary ONE.

Signal UPG000010 at the binary ONE output terminal of flip-flop 204-6 is applied directly and indirectly through a 30 nanosecond delay circuit 204-10 to an AND gate 204-12. The resulting signal UGONS010 is applied to an OR gate 204-20 to force signal UPTRG0010 to a binary ONE conditioning the timing generator circuits 204-1 to generate the desired sequence of timing signals. Also, signal UPTRG0010 is forced to a binary ONE by an AND gate 204-18 in response to timing signal RW1DTH000 from generator circuits 204-1 when refresh signal REF20N010 is forced to a binary ONE by section 205.

The timing signals PARTWT010 and PARTWW010, generated during byte write operations for initiating an additional sequence of timing pulses, are applied to the circuits of section 208 along with signal UPG000000 from flip-flop 204-6. An AND gate 204-22 combines timing signal MRASSN010 with signals REFCOM000 and 2CYINH000 to generate signal MDOMCT010. Signal MDOMCT010 is applied to the gate (G) input terminals of the data registers of blocks 206-8 and 206-10 of section 206. An AND gate 204-24 combines timing signal MCASSN010 with refresh signal REFCOM000 to generate signal MCASCT000. Signal MCASCT000 is applied to the OC control terminals of the column address registers of sections 207 and 214. Also, AND gate 204-30 combines signal MCASSN010 after being inverted by an inverter circuit 204-28 with signal REFCOM100 in an AND gate 204-30 to generate signal MRASCT000. Signal MRASCT000 is applied to the OC control terminals of the row address registers of sections 207 and 214. A last control signal MREFCT100 is generated from signal REFCOM000 via an AND gate 204-26. Signal MREFCT100 is applied to the OC control terminals of the refresh address registers of sections 207 and 214. Signals MRASSN010 and MCASTM010 are applied to the row address strobe (RAS) and column address strobe (CAS) input terminals of all of the daughter boards containing good memory device 220-40 and partial memory device 220-20.

A further timing signal MEMBUZ1TE, generated by the circuits 204-1, is applied to a NOR gate 204-40 together with timing signal MRASSN010 and bus control signals MYACKR010 and MYDCNN010, in addition to other signals (not shown) from section 211. The NOR gate 204-40 is operative to generate memory busy signal MEMBUZ000 which an OR gate 204-42 and an AND gate 204-44 combines with signals UPMODE110 and MBUZUP010 to generate external memory busy signal EXTMBZ000. The binary ONE state of signal MBUZUP010 indicates when microprocessor section 216 is busy performing a read or write cycle of operation. This signal is generated by a pair of NAND gates 204-46 and 204-50 combining the pairs of signals UPG000000, UPMODE110 and CSMOS1000, and ORing the resulting signals UPG001010 and CSMOS12010 in an OR gate 204-48. Signal EXTMBZ000 is applied to the gate G input terminal of the address register 207-10 of section 207, to the read/write circuits of section 208 and to the circuits of section 211. Timing pulse MTREDY010 generated by timing generator circuits 204-1 occurs at the end of the timing sequence and is used to notify the microprocessor section 216 that it is the end of a memory cycle.

Sections 208 and 208-100

Figure 2B:
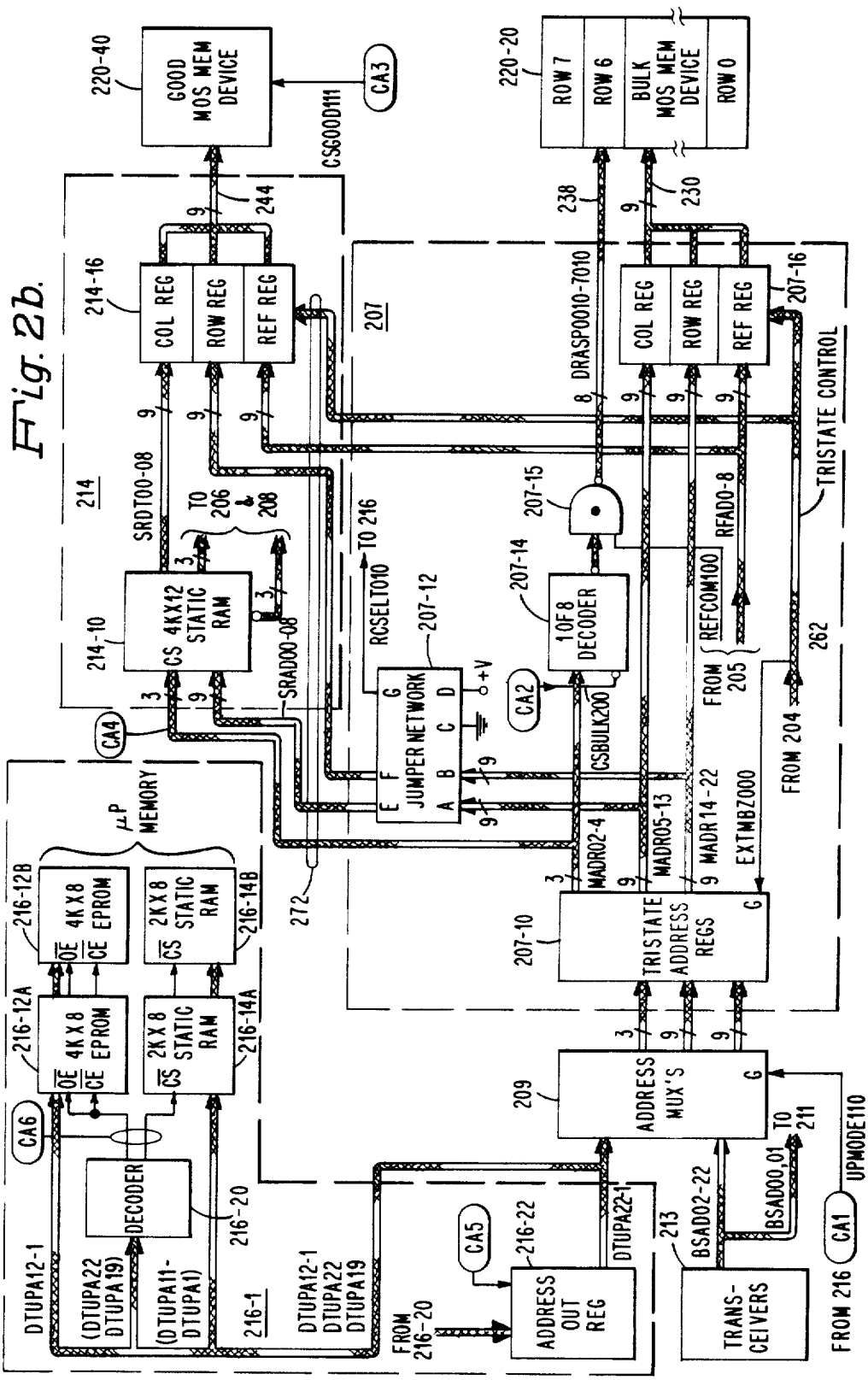
Figure 2C:
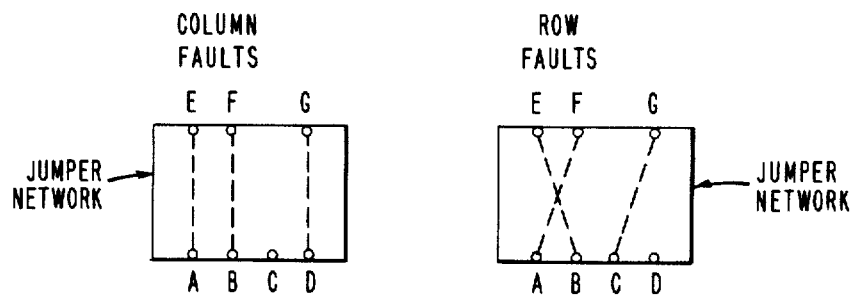
Figure 2D:
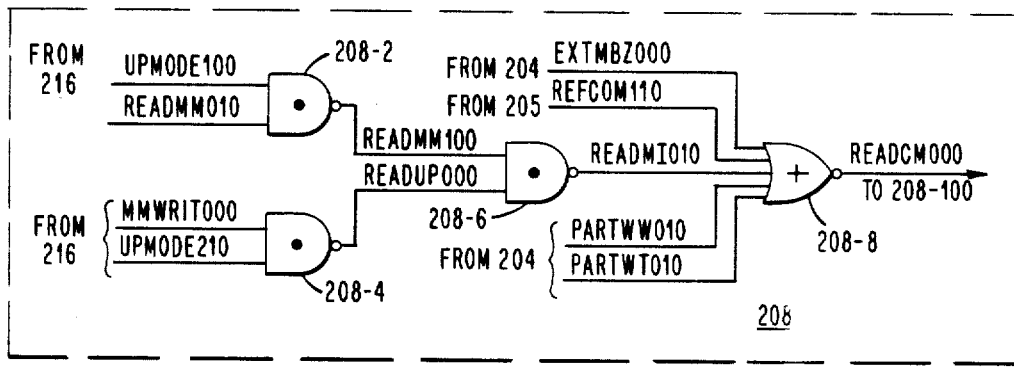
Figure 2E:
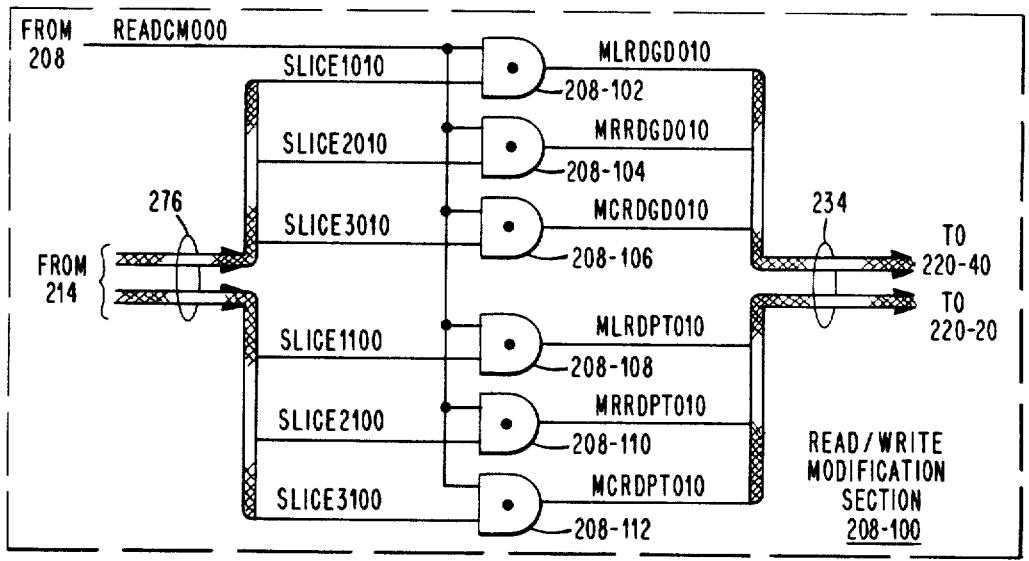

FIGS. 2d and 2e, respectively, illustrate in greater detail a portion of read/write control section 208 and read/write modification section 208-100. The circuits of section 208 generate the read command signal READCM000 in response to signals REFCOM110, PARTWW010, EXTMBZ000 and PARTWT010. The signal is applied to the circuits of section 208-100.

In greater detail, a NAND gate 208-2 generates signal READMM100 by combining microprocessor mode signal UPMODE100 and a read memory command signal READMM010 from a command register, not shown, which stores the states of signals BSWRIT, BSBTYE and BSAD23 received from bus transceiver circuits of block 213.

Similarly, a NAND gate 208-4 generates signal READUP000 by combining signal UPMODE210 and microprocessor memory write signal MMWRIT000. The signals MMWRIT000 and READMM100 are combined in a NAND gate 208-6 which generates read memory signal READMI010. A NOR gate 208-8 in response to any one of the signals READMI010, EXTMBZ000, REFCOM110, PARTWW010 and PARTWT010 being forced to a binary ONE forces read command signal READCOM000 to a binary ZERO to initiate a memory read cycle of operation.

Section 208-100 includes two sets of AND gates 208-102 through 208-112. Each of the gates is connected to receive as one input, read command signal READCM000. Each of the first set of AND gates 208-102 through 208-106 is connected to receive a different one of the three slice bit signals SLICE1010 through SLICE3010 generated by section 214. Each of the second set of AND gates 208-108 through 208-112 is connected to receive a different one of the complementary three slice bit signals SLICE1100 throuth SLICE3100 generated by section 214.

Each of the output signals MLRDGD010, MRRDGD010 and MCRDGD010, generated by one of the AND gates 208-102 through 208-106, is applied to a different one of the groups of 256K RAM chips of good memory device 220-40. Similarly, each of the output signals MLRDPT010, MMRDPT010 and MCRDPT010 generated by one of the AND gates 208-108 through 208-112 is applied to the same different one of the groups of 256K RAM chips of partial memory device 220-20. These sets of signals are inverted and applied to the read/write terminals of the 256K RAM chip groups as discussed herein. Thus, these signal specify whether or not the 256K RAM chip is to perform a read or write cycle of operation.

Address Path-Sections 207 and 214

FIG. 2b illustrates in greater detail those portions of sections 207, 214 and 216 involved in the transfer and generation of addresses according to the teachings of the present invention. Additionally, the Figure indicates the source of control address signals by the designation CA followed by a numerical value. These signals have section 216 as their source.

It is seen that section 207 has microprocessing section 216 and the bus which connects to the driver/receiver circuits (constructed from 26S10 chips) of section 213 as address sources. Under the control of a control address (CA1) signal UPMODE110 from section 216, address multiplexer circuits 209 constructed from 74S257 chips, selectively apply address signals DTUPA22-UPA1 and BSAD02-22 to their output terminals. The selected address signals are loaded into tristate controlled registers 207-10 constructed from 74S373 chips. The registers 207-10 which are gated under control of signal EXTMBZ000 from section 204 permit the freezing of the address signals applied to memory section 20. The bus address signals BSAD00 and BSAD01 are applied to module identification circuits of section 211.

Figures 3, 4:
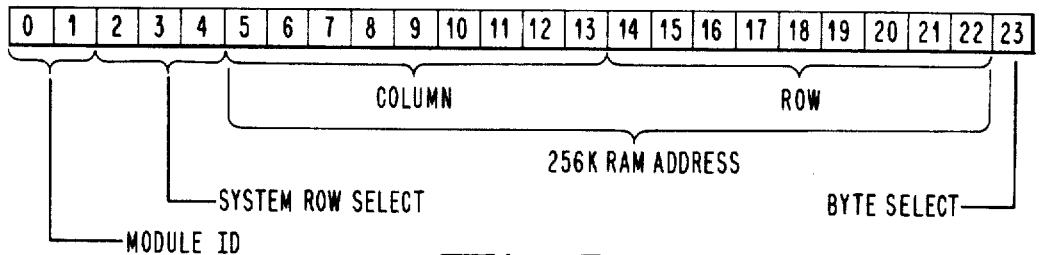
FIG. 3 shows the format of the memory command/microprocessor addresses applied to the memory system of FIG. 1.
FIG. 4 shows an example of how the static remap section 214 of FIG. 1 is mapped for column or row defects according to the present invention.

As shown, different portions of the address signals are applied as inputs to a jumper network 207-12 and to a 1 of 8 decoder circuit 207-14 constructed from a 74S138 chip. The address format for the different portions of the address signals such as bus address signals BSAD02-22 is shown in FIG. 3. The state of signal BSAD23 defines which byte left or right is being modified during a byte write operation while the next 18 address signals BSAD5-22 define the particular bit location within each 256K RAM chip of partial memory device 220-20. That is, address signals BSAD14-22 are used to specify the row within each chip while address signals BSAD5-13 are used to specify the column within each chip. Bus address signals BSAD02-04 specify the system row of chips within device 220-20 while bus address signals BSAD00-01 are used to identify which memory controller/module of memory system is being addressed (e.g. system 20). The bus address signals are applied to section 211 and are decoded by circuits contained therein. It will be appreciated that the address signal DTUPA22-UPA1 have the same address format as signals BSAD02-22.

Accordingly, the address signals MADR02-4 applied to decoder circuit 207-14 are decoded by a 1 of 8 decoder circuit 207-14 which receives an enabling signal CA2/CSBULK200 from section 216. Each of the eight decoder output signals is applied to a different 1 of 8 NAND gates of block 207-15 which receive refresh signal REFCOM100 from section 205. The resulting decoded row address signals DRASP0010-7010 are applied to the eight system rows of 256K RAM chips of device 220-20. The row address signals MADR14-22 are applied to a first set of inputs designated as B of jumper network 207-12 and to a row address register within a set of three tristate controlled registers of block 207-16 constructed from 74S373 type chips. The column address signals MADR05-13 are applied to a second set of inputs designated as A of jumper network 207-12 and to a column address register within the set of registers of block 207-16. The last register of the set of registers is connected to receive refresh address signals RFAD0-8 from section 205.

The different output terminals of the set of registers 207-16 are connected in a wired OR arrangement for enabling the multiplexing of row, column and refresh address signals onto path 230. Such multiplexing is accomplished by controlling the states of signals MRASCT000, MCASCT000, and MREFCT100, respectively, applied to the output control (OC) input terminals of the row, column and refresh registers. That is, when signal MRASCT000, MCASCT000 or MREFCT100 is in a binary ONE state, this inhibits any address signals from being applied to the output terminals of the corresponding register.

The jumper network 207-12 permits the use of 256K RAM chips with either row faults or column faults in memory device 220-20. The wiring configuration of jumper network for row and column faults is shown in FIG. 2c. When jumper network 207-12 is configured for 256K RAM chips having only column faults, it is seen that the column address signals MADR05-13 applied to inputs A appear at a set of outputs E and are fed to the address input of static RAM memory 214-10 of remap section 214. The row address signals MADR14-22 applied to inputs B appear at a set of outputs F and are fed as an input to the row address register of a set of tristate controlled registers 214-16 of section 214. This set of registers is connected in the same manner as the registers of block 207-16 for multiplexing row, column and refresh addresses onto path 244 for addressing the 256K RAM chips of good memory device 220-40.

When jumper network 207-12 is configured for 256K RAM chips having only row faults, it is seen that the column address signals MADR05-13 applied to inputs A, appear at outputs F and are fed as inputs to the row address register. The row address signals MADR14-22 applied to inputs B, appear at outputs E and are fed to the address inputs of static RAM 214-10. It will be noted that in the case of row faults, the column address signals MADR05-13 now serve as the row address of the good memory device 220-40. This ensures that there is no loss in memory performance in determining the location of defective rows in bulk memory device 220-20 notwithstanding the type of defective chips used in constructing partial memory device 220-20.

Figure 2F:
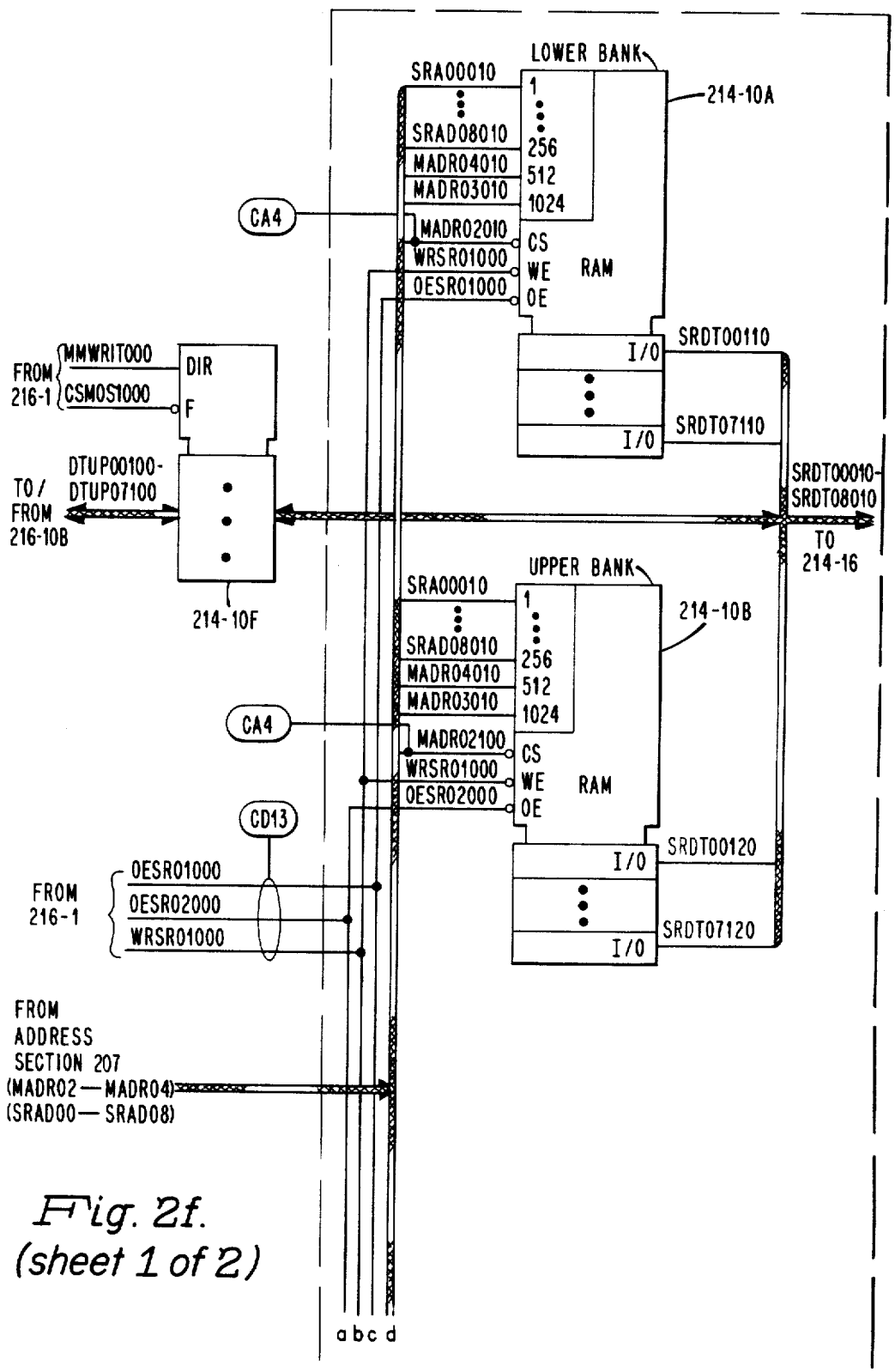
Figure 2F:
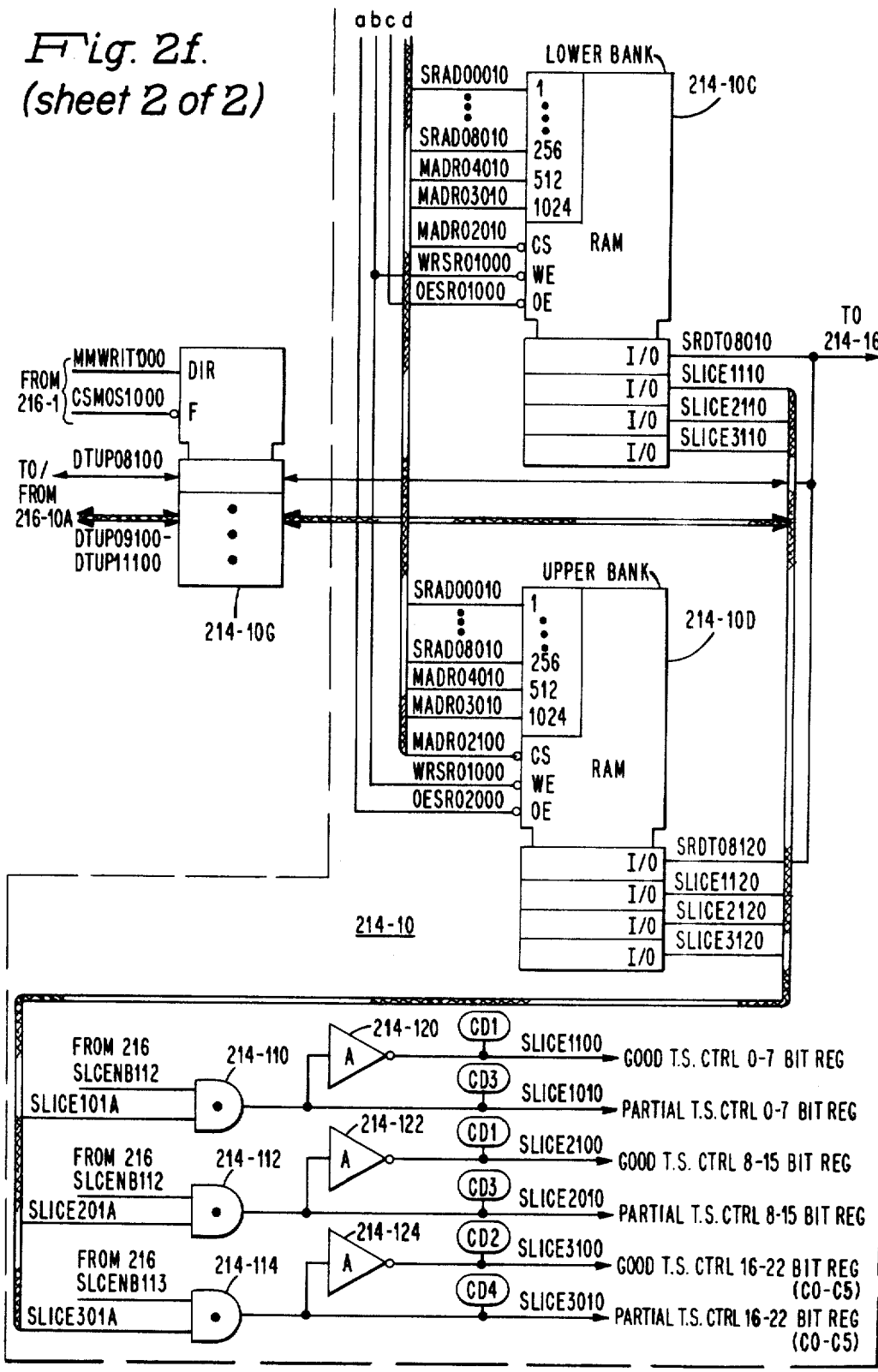

As explained herein, static RAM 214-10, shown in greater detail in FIG. 2f, is used to generate nine translated column address signals and three slice control signals. The column address signals are applied to the column address register of block 214-16. The refresh address register receives refresh address signals RFAD0-8 from section 205. Also, signals MRASCT000, MCASCT000 and MREFCT100 from section 204 are applied to the output control (OC) terminals of the row, column and refresh address registers of section 214. The selected row, column or refresh address from one of the registers of block 214-16 is applied via path 244 to good memory device 220-40. Additionally, memory device 220-40 receives a row address decode signal CA3/CSGOOD111 from section 216 designated by CA3.

It is also seen from FIG. 2b that jumper network 207-12 includes inputs C and D and an output G. The network 207-12 is additionally configured in the case of column faults to connect output G to a voltage +V. For row faults, output G connects to ground. The output G corresponds to row/column select signal which is used by microprocessing section 216 to establish whether or not partial memory device 220-20 has row or column faults. When the R/C select signal RCSELT010 is a binary ONE, the partial memory contains 256K RAM chips with column faults. The binary ZERO state of the R/C select signal RCSELT010 indicates that the partial memory contains 256K RAM chips with row faults.

Additionally, the address path of FIG. 2b includes a portion of section 216. As shown, the microprocessor address signals from unit 216-20 are loaded into an address register 216-22 constructed from 74S373 chips which is gated by control address signal CA5/UPADLE100. The microprocessor address signals DTUPA22, DTUPA19 and DTUPA12-1 are applied to a microprocessor memory of section 216-1. As shown, the memory includes 2K of static random access memory which corresponds to 2, 2,048 word×8-bit static RAM chips 216-14A and 216-14B designated as HM6116, manufactured by Hitachi Corporation, and 2, 4,096 word×8-bit erasable PROM chips 216-12A and 216-12B designated as 2732A-2, manufactured by Intel Corporation.

The 2K static RAM chips 216-14A and 216-14B receive 11 address bit signals which correspond to low order 11 address bit signals DTUPA11-1. The 4K EPROM's 216-12A and 216-12B receive 12 address bit signals which correspond to the low order 12 address bit signals DTUP12-1. Address bit signals STUPA21 and DTUPA19 are used by a decoder circuit 216-20 shown in greater detail in FIG. 6c for generating chip selection signals designated as control address signals CA6. It will be noted that the decoding for the microprocessor memory does not include address bit signal DTUPA23, since this space is not addressed. Address bit signal DTUPA22 is included to distinguish between the partial memory address space (i.e., where bit 22=1) and the lower two megawords of address space (i.e., where bit 122=0). Address bit signal DTUPA19 is used to permit the selection of the upper ¼ megaword of address space or the bottom megaword of a ½ megaword address segment. The decoding is carried out so that only used address space is addressed thereby simplifying the construction of the decoder circuit 216-20 of FIG. 6c.

Section 214

FIG. 2f shows in greater detail, the static remap memory section 214 of the present invention. As seen from the Figure, the remap section 4, 2,048×8-bit RAM chips designated as HM6116 receive nine address signals SRAD00010-08010 from the jumper network outputs E together with three system row address select signals MADR04010-02010. The address signals MADR04010 and MADR03010 are applied to the most significant address input terminals while address signal MADR02010 and its complement signal MADR02100 are applied to the chip select (CS) terminals of the pairs of chips for the selection of the lower and upper bank of chips.

The I/O terminals of chips 214-10A and 214-10B are wire ORed together to provide the first eight address signals SRDT00010-07010 which feed good memory device 220-40. Additionally, the chips I/O terminals connect to the microprocessor data bus 216-10 via the directional circuits of block 214-10F. The ninth address signal SRDT08010 is provided by chips 214-10C and 215-10D, in addition to the slice bit signals SLICE101A through SLICE301A. Again, the I/O terminals of the chips are wire ORed together and connect to data bus 216-10 via the directional circuits of block 214-10G. It will be noted that only one-half of the number of bits of chips 214-10C and 214-10D are utilized leaving room for expansion.

Each of the slice bit signals SLICE101A through SLICE301A is applied to a different one of three AND gates 214-110 through 214-114. The first two slice bit signals SLICE101A and SLICE201A are "anded" with a control enable signal SLCENB112 from section 216. The third slice bit signal SLICE301A is "anded" with a control enabled signal SLCENB113 from section 216.

During normal operation, signals SLCENB112 and SLCENB113 are both binary ONES. The resulting signals SLICE01010 through SLICE3010 are inverted by inverter circuits 214-120 through 214-124. Also, during normal operation, both control signals MMWRIT000 and CSMOS1000 from section 216 are normally binary ONES which effectively disconnects the chips from data bus 216-10. The set of slice bit signals SLICE1010 through SLICE3010 and their complement set of slice bit signals, SLICE1100 through SLICE3100, are applied to sections 206 and 208.

Section 220

FIG. 2g shows in greater detail, the partial memory daughter board arrangement of the preferred embodiment. The Figure shows two daughter boards, each containing four system rows of 256K RAM chips, each row having 22 chips. As shown, the chips are organized into three groups. The first group of eight chips have their R/W terminals connected to receive read/write signal MLRDPT010 via a pair of inverter circuits 220-208 (i.e., one for each daughter board) from section 208-100. The second group of eight chips have their R/W terminals connected to receive read/write signal MRRDPT010 via a pair of inverter circuits 220-210. The third group of six chips have their R/W terminals connected to receive read/write signal MCRDPT010 via a pair of inverter circuits 220-212.

Additionally, each chip receives the set of nine address signals from section 207 via circuits 220-26. The column address strobe timing signal MCASTM010 generated by the circuits of section 204 is applied to the CAS terminals of the chips of each system row via a NAND gate (e.g. gates 220-200 and 220-204). The row address strobe timing signal MRASSN010 is applied to the RAS terminals of the chips of each system row via a NAND gate (e.g. gates 220-202 and 220-206). Additionally, each NAND gate is connected to receive an appropriate one of the row decode signals from section 207 (i.e., signals DRASP0010 through DRASP7010).

The data input and data output terminals of all of the chips of the same columns of partial memory device 220-20 are connected in common (wired ORed). The data input terminals of all rows of 256K RAM chips connect in common, while only the data output terminals of each group connect in common to the different data registers of block 206-8 of FIG. 1.

The daughter board arrangement of good memory section 220-4 is organized similar to section 220-2. The differences are that there are only a single system row of 22, good 256K RAM chips which receive the same address, column and row address strobe signals as section 220-2. However, the NAND gate connected to receive row address strobe signal MRASSN010 receives row enable decode signal CSGOOD111 from section 216.

In the preferred embodiment of the present invention, the three groups of chips receive a different set of read/write signals from section 208-100. That is, the first group of eight chips have their R/W terminals connected to receive read/write signal MLRDGD010. The second group of eight chips have their R/W terminals connected to receive read/write signal MRRDGD010. The third group of chips have their R/W terminals connected to receive read/write signal MCRDGD010. The data input and output terminals of the 256K RAM chips connect to the different data registers of block 206-10 of FIG. 1.

Data Path Sections 206 and 216

FIG. 2h shows in greater detail, certain portions of sections 206, 214 and 216, in addition to the source of control data signals by the designation CD followed by a numerical value. These signals have sections 214 and 216 as their source. As shown, both partial memory device 220-20 and good memory device 220-40 receive the same data input signals which correspond to 16 data bits and six check bits from tristate controlled registers 216-302, 216-303 and 216-304 of block 216-30. These registers are controlled by a control data signal (CD10).

On the output side, good memory device 220-20 connects to three tristate controlled registers of block 206-10. That is, 16 data bits are loaded into two tristate controlled registers which are controlled by control data signals CD1 from section 214 and the six check bits are loaded into the third tristate controlled register which is controlled by control data signal CD2 from section 214. The same three-register arrangement is used for partial memory device 220-40. That is, 16 data bits are loaded into two registers controlled by control data signals CD3 from section 214 and six check bits are loaded into a third register which is controlled by a control data signal CD4 from section 214.

The outputs from the memory devices are applied to the set of three tristate controlled registers 216-306, 216-308 and 216-310 as shown. The registers 216-306 and 216-310 are controlled by a control data signal CD6 from section 216-1 while register 216-310 is controlled by a control data signal CD5 from section 216-1.

The sets of registers of block 216-30 connect to the two different sections, 216-10A and 216-10B, of data bus 216-10. Additionally, a tristate controlled register 216-2 which is used to generate various control signals connects to data bus section 216-10B and to a second tristate controlled register 216-4 which connects back onto data bus section 216-10B. Control data signals CD9 and CD12 from section 216-1, respectively, control the operation of control register 216-2 and register 216-4. This arrangement permits loading and verification of the loaded contents of control register 216-2 by microprocessing section 216-1.

The remap memory section 214 and microprocessing section 216-1 both connect to both data bus sections 216-10A and 216-10B, as shown. The 4K×16 static RAM remap memory 214-10 includes 4, 2,048 word×8-bit static RAM chips 214-10A through 214-10D, constructed from HM6116 chips. The chips are enabled for writing and data readout by control signals CD13 from section 216-1. The data input/output terminals of the HM6116 chips are buffered from the data bus sections 216-10A and 216-10B by bidirectional circuits 214-10F and 213-10G constructed from 74LS245 chips. The direction of data transfer and transfer between the memory 214-10 and bus are controlled by the states of the control data signals CD8 which are applied to the 74LS245 circuits via section 216-1.

The data terminals of the EPROM and static RAMs 216-12A, 216-12B and 216-14A, 216-14B of microprocessor memory also connect to both data bus sections 216-10A and 216-10, as shown. The static RAM chips are enabled for writing and read out by control signals CD14 from section 216-1. Lastly, the data terminals D0-D15 of a 16-bit microprocessor system 216-10 are buffered from both data bus sections 216-10A and 216-10B by the 74LS245 bidirectional circuits of blocks 216-6 and 216-8. The direction of data transfer and transfer between the microprocessor system 216-10 and bus 216-10 are controlled by the states of the control data signals CD7 which are applied to the 74LS245 chip circuits via section 216-1.

Section 216

Figure 6A:
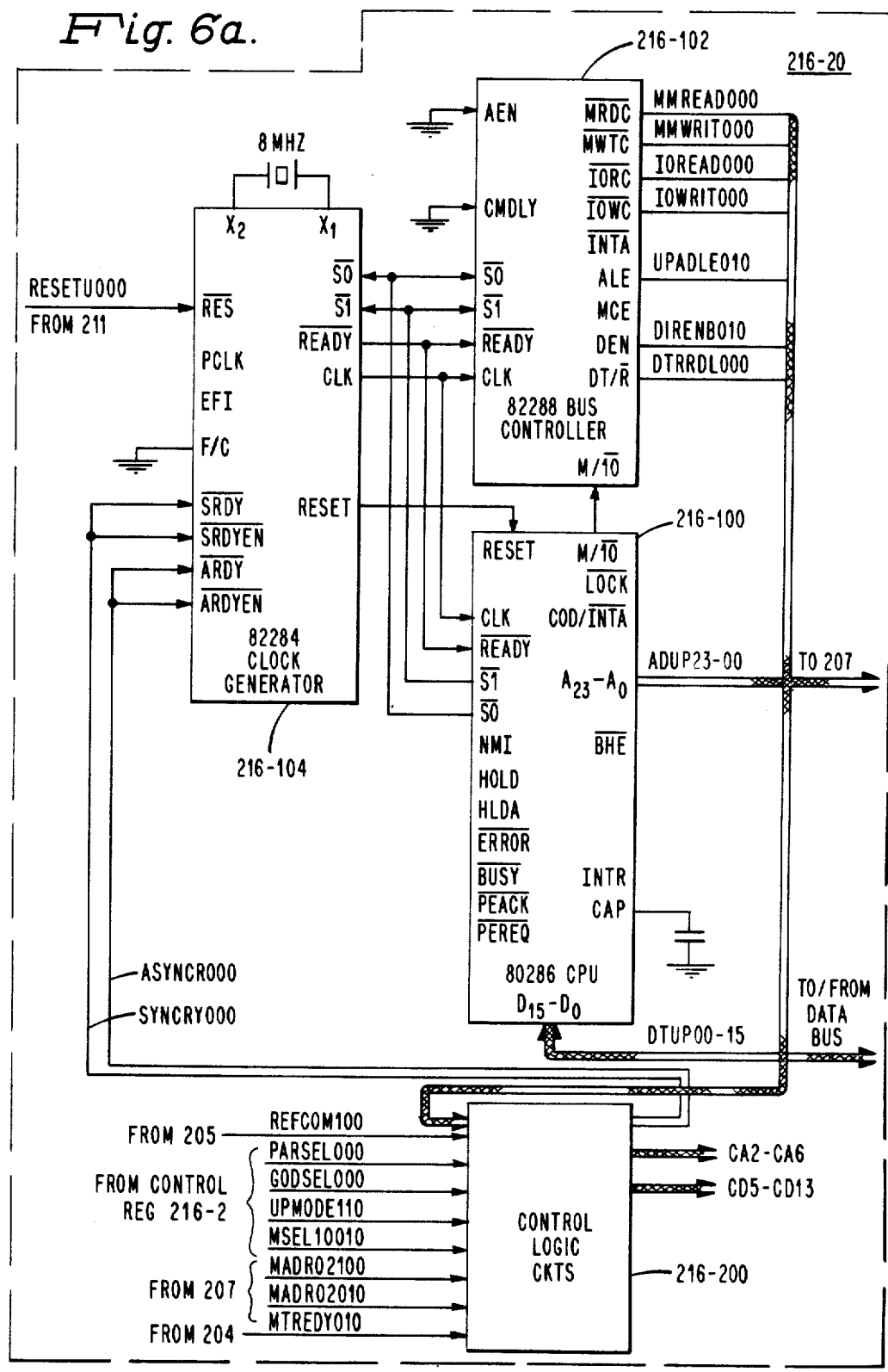
Figure 6B:
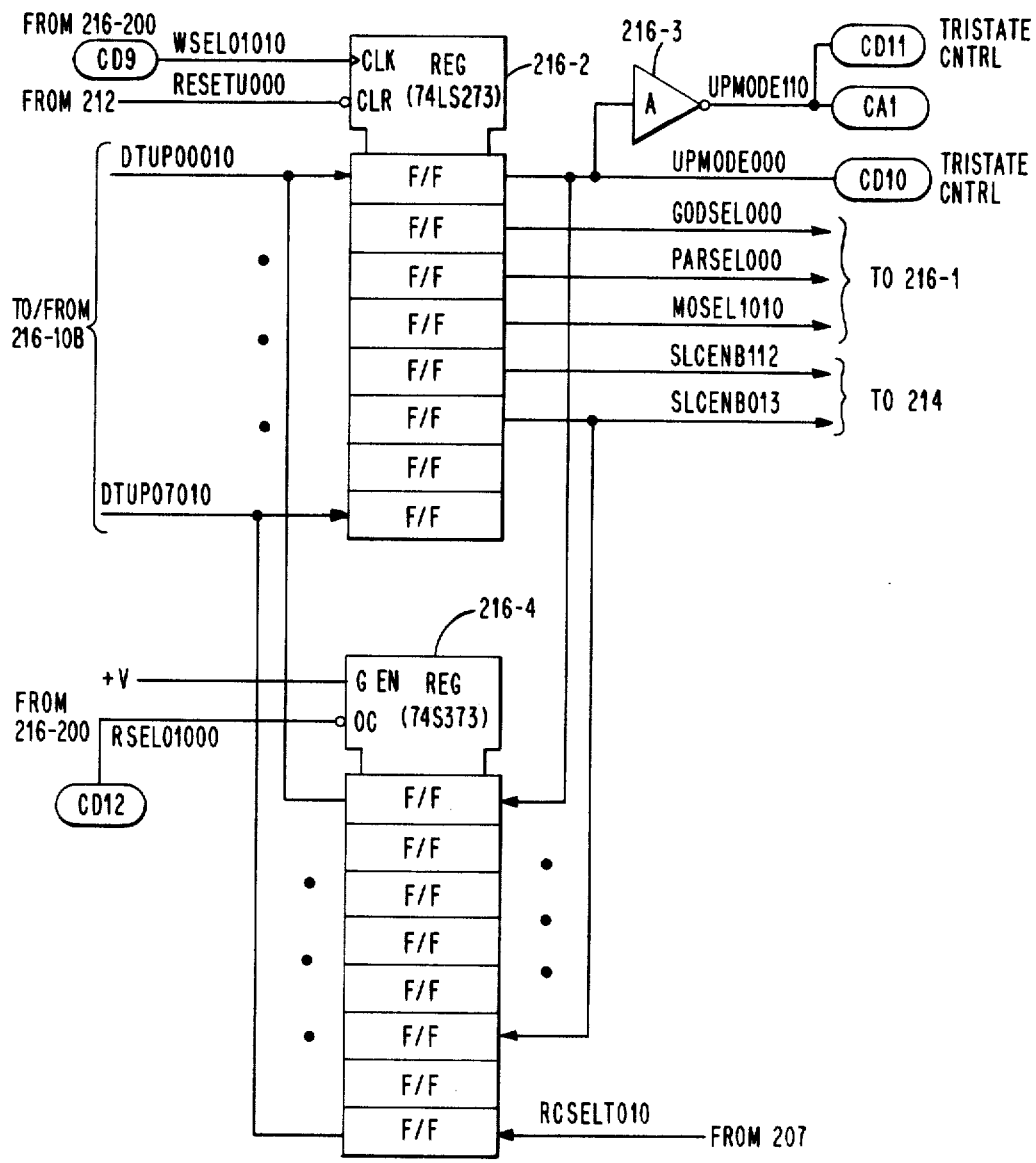

FIGS. 6a, 6b and 6c show in greater datail portions of section 216-1. FIG. 6a shows the 80286 CPU chip 216-100, the 82288 bus controller chip 216-102 and the 82284 clock generator chip 216-104 which make up microprocessor 216-20. The clock generator chip 216-204 generates the clock, ready and reset signals required for operating CPU 216-100 and bus controller 216-102. It generates a 8 megahertz crystal controlled two-phase clock at terminal CLK signal to control bus timing. The CPU chip 216-100 divides down the clock signal by two producing an 4 megahertz processor clock signal which is used to define bus state. The RESET output terminal of clock generator 216-104 generates a reset output pulse in response to signal RESETU000 applied to a $\overline{\text{RES}}$ input terminal by section 211. This provides an orderly way of initializing CPU 216-100.

Additionally, the clock generator 216-104 generates a ready signal on a $\overline{\text{READY}}$ line in response to both synchronous and asynchronous sources. The signal applied to the $\overline{\text{READY}}$ line identifies the last cycle of a current processor bus operation. Input terminals $\overline{\text{SRDY}}$ and $\overline{\text{SRDYEN}}$ are connected in common to accept a synchronous source signal SYNCRY000 from the control logic circuits 216-200 while input terminals $\overline{\text{ARDY}}$ and $\overline{\text{ARDYEN}}$ are connected in common to accept an asynchronous source signal ASYNCR000 from the circuits 216-200. A pair of status inputs $\overline{\text{S0}}$ and $\overline{\text{S1}}$ are connected to receive signals from CPU 216-100 which condition clock generator circuit 216-104 for a subsequent bus cycle of operation.

CPU 216-100 has four states which are indicated by signals applied to a pair of status lines $\overline{\text{S1}}$ and $\overline{\text{S0}}$. These include an idle stare (Ti), a status state (Ts), a perform command state (Tc) and a hold state (Th). During the idle state, no data transfers take place, while during the Ts state, the CPU applies commands, address and data to its command, address and data lines. The bus controller chip 216-102 decodes the status signals and generates the appropriate control command signals which are selectively applied to an address latch enable ALE, read/write command $\overline{\text{MRDC}}$, $\overline{\text{MWTC}}$, $\overline{\text{IORC}}$ and $\overline{\text{IOWC}}$, data transmit/receive DT/$\overline{\text{R}}$ and data enable DEN output terminals. During state Tc, the memory or I/O device responds by either transferring data to CPU chip 216-100 or writing data signals DTUP00-15 into memory.

The CPU chip 216-100 initiates a bus cycle by applying coded signals to status output terminals $\overline{\text{S1}}$, $\overline{\text{S0}}$ along with signals to memory/IO select M/$\overline{\text{IO}}$ and code/interrupt acknowledge COD/$\overline{\text{INTA}}$ defining the type of bus cycle. More specifically, the CPU 216-100 initiates a memory data read cycle by forcing terminals M/$\overline{\text{IO}}$, $\overline{\text{S1}}$ and $\overline{\text{S0}}$ to a 1, 0 and 1, respectively. For a memory write cycle, they are forced to states 1, 1 and 0. To initiate an I/O read bus cycle, CPU 216-100 forces terminals COD/$\overline{\text{INTA}}$, M/$\overline{\text{IO}}$, $\overline{\text{S1}}$ and $\overline{\text{S0}}$ to a 1, 0, 0 and 1, respectively. For an I/O write bus cycle, they are forced to states 1, 0, 1 and 0. For further information regarding these chips, reference may be made to the publication titled "iAPX 286/10 High Performance Microprocessor with Memory Management and Protection", published by Intel Corporation, dated January, 1982, Copyright 1982.

Additionally, section 216 includes control logic circuits of block 216-200 which generate the control timing signals SYNCRY000 and ASYNCR000, control address signals CA2-CA6 and control data signals CD5-CD9, CD12 and CD13. These circuits are shown in greater detail in FIG. 6c. The circuits include an AND gate 216-201, NAND gates 216-202 through 216-217, NOR gates 216-220 through 216-226, OR gates 216-230 through 216-238 and inverter circuits 216-240 through 216-252.

In greater detail, NAND gates 216-202 and 216-204 combine read and write command signals MMREAD000 and MMWRIT000 from controller 216-102, and address bit signal ADUP22110 from CPU 216-100 to generate memory request signal MREQPS000. This signal is combined with partial memory select signal PARSEL000 in NOR gate 216-220 to generate bulk memory chips select signal CSBULK010. After being inverted, signal CSBULK010 is "ANDed" by AND gate 216-201 with microprocessor mode signal UPMODE110 to generate control address signal CA2. This signal when forced to a binary ZERO enables decoder circuit 207-14 for operation during a partial memory cycle of operation.

Additionally, memory request signal MREQPS000 is combined with good memory select signal GODSEL000 in NOR gate 216-222 to generate good memory chip select signal CSGOOD110. This signal is ORed with signal CSGSYS010 in OR gate 216-230 to produce control address signal CA3. Signal CA3 when forced to a binary ONE enables the 256K RAM chips of good memory 220-40 for operation. Control address signal CA5 is generated by inverting the address latch enable UPADLE010 from bus controller 216-102. This signal when forced to a binary ONE gates memory address signals into the registers 216-22.

The inverter circuits 216-243 through 216-246 and NAND gates 216-208 and 216-210 form the decoder 216-20. The decoder 216-20 decodes memory address signals ADUP19110 and ADUP22110 from CPU 216-100 in response to read and write command signals MMREAD000 and MMWRIT000. During a memory read cycle, decoder circuit 216-20 generates a first of the pair of control address signals CA6 as a function of address signals ADUP19110 and ADUP22110. During read and write cycles of operation, decoder circuit 216-20 generates a second of the pair of control address signals CA6 as a function of address signals ADUP19110 and ADUP22110. When the decoder 216-20 forces signal UPROM3000 to a binary ZERO, the PROM chips 216-12A and 216-12B are enabled for read out. Similarly, when signal UPRAMS000 is forced to a binary ZERO, static RAMs 216-14A and 216-14B are enabled for operation.

The control data signal CD9 is generated by NOR gate 216-224 which combines address signal ADUP01110 and bus controller I/O write signal IOWRIT000. When signal WSEL01010 is forced to a binary ONE, data is latched into control register 216-2. Each of the OR gates 216-232 through 216-236 combine different ones of the address signals ADUP01110 through ADUP03110 with bus controller I/O read signal IOREAD000 to generate control data signals CD12, CD6 and CD5. Whenever any one of these signals is forced to a binary ZERO state, the contents of the register(s) connected thereto (i.e., 216-4, 216-306, 216-308, 216-310) is applied to the register(s) output terminals.

One of a pair of control data signals CD7 is generated as a function of bus controller transmit/receive signal DTRRDL000. The second control data signal CD7 is generated by inverting bus controller data enable signal DIRENB010. The pair of signals CD7 control the operation of directional register circuits 216-6 and 216-8. That is, signal DTRRDL000 establishes the direction of transfer while signal DIRENB010 establishes when the received signals are to be transferred.

Additionally, bus controller transmit/receive signal DTRRDL000 is inverted to generate one of the pair of control data signals CD8. The second control data signal CD8 is generated by combining signals, DIRENB100, MSEL10010 and ADUP22000 in NOR gate 216-226 and inverting the resulting signal CSMOS1010. The pair of signals CD8 control the operation of directional register circuits 214-10F and 214-10G of FIG. 2h. That is, signal DTRRDL110 establishes the direction of transfer while signal CSMOS1000 establishes when the received signals are to be transferred.

The set of three data control signals CD13 is generated as follows. The first data control signal which serves as a write enable signal is generated by combining signal CSMOS1000 and bus controller memory write signal MMWRIT000 in OR gate 216-238. The next two data control signals are generated by combining signals MSEL10010, ADUP22010, DIRENB010 and DTRRDL000 with memory address signal MADRO2010 and its complement signal MADRO2100 in NAND gates 216-212 and 216-213, respectively. All three signals are used to enable the upper and lower bank of chips of static remap memory 214-10 for read and write operations.

The first of the pair of control data signals CD14 is generated by NAND gate 216-214 which combines signals MMREAD110, ADUP22200 and ADUP19200. The second signal CD14 is generated in a similar fashion by NAND gate 216-215 which combines signals MMWRIT110, ADUP22200 and ADUP19200. The pair of signals CD14 are used to enable the RAM chips 216-14A and 216-14B for read and write operations.

A last pair of NAND gates 216-216 and 216-217 generate asynchronous and synchronous clock control signals ASYNCR000 and SYNCRY000. Signal ASYNCR000 is generated by combining timing generator signal MTREDY010 with mode signal UPMODE110 and address signal ADUP22010. Signal MTREDY010 is generated to indicate the end of a memory cycle of operation. Signal SYNCRY000 is generated by combining address signal ADUP22000 with signal MREQUP010.

FIG. 6b shows in greater detail, the control register 216-2 and auxiliary register 216-4. Both registers connect to the data bus section 216-10B. The control register 216-2 is constructed from an SN74LS273 chip, while register 216-4 is constructed from an SN74S373 chip. Control register 216-2 is loaded by CPU 216-100 in response to signal WSEL01010/CD9 applied to a clock input terminal CLK generated by the control logic circuits of block 216-200. It is cleared in response to a reset signal RESETU000 generated during system power up by section 211.

The control register 216-2 generates the microprocessor mode signals UPMODE000/CD10 and UPMODE110/CD11 via an inverter circuit 216-3 in addition to memory select signals GODSEL000, PARSEL000 and MOSEL1010 and enable signals SLCENB112 and SLCENB013. These signals enable CPU 216-100 to control the operations of the different sections indicated during remapping operations as explained herein.

The auxiliary register 216-4 in addition to enabling the testing of control register 216-2, permits CPU 216-100 to sample the states of those conditions needed to perform remap operations. One such signal is the row/column select signal RCSELT010 applied to the last stage of register 216-4. This signal is generated by section 207 and its state indicates the type of chips used to construct partial memory device 220-20. The CPU 216-100 controls the read out of register 216-4 contents by signal RSEL01000/CD12 applied to the output control (OC) terminal. This signal is generated by the control logic circuits of block 216-200.

DESCRIPTION OF OPERATION

The operation of the dynamic mapping apparatus included in memory system 20 of the preferred embodiment of the present invention will now be described with reference to FIGS. 1–7d4. Before discussing the operation, reference is first made to FIG. 5. This Figure shows how the address memory space of microprocessor section 216 is allocated according to the present invention.

The maximum addressable space is eight megawords. Since the upper four megawords of space are not used, the memory space between 4MW-8MW, having hexadecimal addresses 400000 and 7FFFFF, is labeled as an unused region. The space allocated to partial memory device 220-20 which has a capacity of two megawords lies between 2MW-4MW and corresponds to the range of hexadecimal addresses 200000-3FFFFF. The space between ½MW-2MW is another unused region. The bottom ½MW of space is allocated to the microprocessor memory. More specifically, the bottom ¼MW of space between hexadecimal addresses 000000 and 0007FF is allocated to static RAMs 216-14A and 216-14B of FIGS. 2b and 2h. The upper 4K words of the bottom ¼MW section between hexadecimal addresses 07F000 and 07FFFF are allocated to EPROMs 216-12A and 216-12B of FIGS. 2b and 2h. The space between hexadecimal addresses 000800 and 07EFFF is unused.

Figure 5:
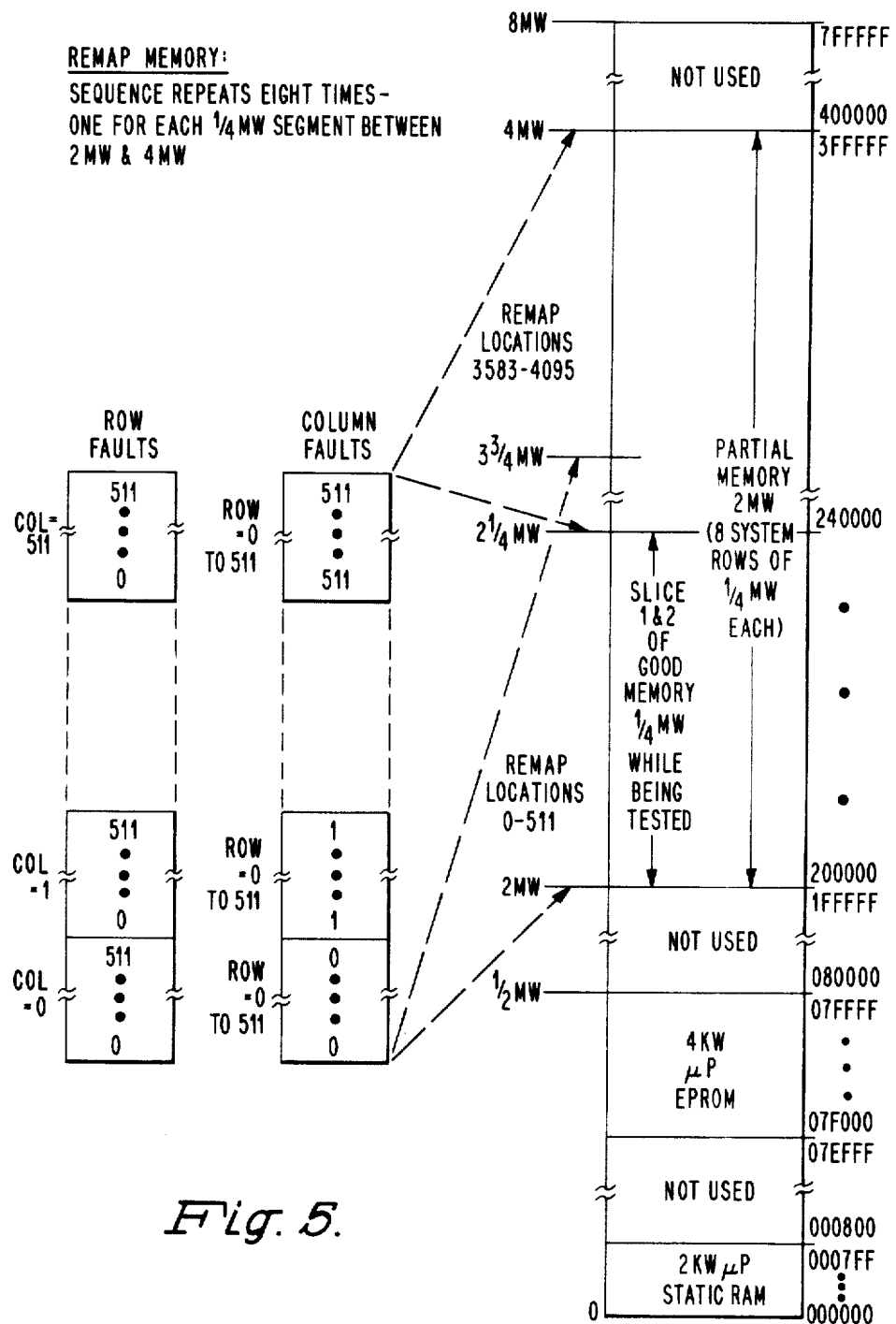
FIG. 5 shows the assignment of addressable memory space by the microprocessing section of FIG. 1.

As shown in FIG. 5, the partial memory device 220-20 occupies the entire address range between 2MW-4MW. Since the good memory device 220-40 has ⅛th the storage capacity of partial memory device 220-20, microprocessor section 216, during its testing of slices 1 and 2 of good memory device 220-20, will access the space between 2MW and 2¼MW and 2½MW during its testing of slice 3 (i.e., 2MW divided by 8). The left side of FIG. 6 shows the static remap memory addressing for column and row faults for the amount of static remap memory which coincides with the bottom ¼MW of partial memory space. Stated differently, the 4K of static remap memory 214-10 is used to remap the entire 2MW of partial memory space. Since there are eight system rows of 256K RAM chips of partial memory, static remap memory 214-10 is divided into eight sections, one section per system row of chips. Each segment corresponds to 512 locations (i.e., 4K divided by 8). Accordingly, each ¼MW of partial memory 220-20 is mapped with 512 locations of static remap memory 214-10.

Referring to the bottom ¼MW of partial memory with row faults, microprocessing section 216-1 starts addressing partial memory 220-20 with octal location 200000 which corresponds to the first octal location (address 0) of the partial memory 220-20. Referring to the left side of FIG. 5, it is seen that the first location addressed in partial memory 220-20 with row faults is location 0. As the partial memory address is incremented, the first 512 locations within static remap memory 214-10 are sequenced through until the 511th location is reached. The next incrementing of the partial memory address causes the column address to advance from column address 0 to column address 1. At the same time, the lower row address bits are returned to 0. Continued incrementing of the partial memory address results in sequencing through row addresses 0-511 of static remap memory 214-10 for a column address equal to 1. Stated differently, the bottom 512 locations of remap memory 214-10 are sequenced through a second time. The same sequencing continues until column address 511 and row address 511 are reached. When the partial memory address is incremented by one, addressing advances to the next ¼MW segment of partial memory 220-20. The entire address sequence depicted in FIG. 5 is again repeated for the range of partial memory addresses 512-1023. The entire sequence is repeated a total of eight times with the last range of static remap memory addresses 3583-4095 completing the addressing of the last ¼MW segment of partial memory.

Referring again to the left side of FIG. 5, it is seen that the addressing of partial memory 220-20 with column faults starts at logical address 0 which corresponds to address 0 of static remap memory 214-10. As seen by FIG. 5, incrementing the partial memory address results in incrementing the row addresses. Since row addresses are not used by static remap memory for column faults, the static remap memory address remains at location 0 for the first 512 partial memory addresses sequenced through. When th partial memory address is incremented by one, the the column address advances from 0 to 1 and the row address is returned to 0.

As the partial memory address is incremented, the row addresses increment from 0 to 511 while static remap memory remains at location 1. The same address sequencing is repeated until a column address of 511 is reached. As the partial memory address increments through row addresses 0-511 for the next 512 locations, the column address remains at 511. When the row and column addresses are both 511, addressing advances to the next ¼MW of partial memory 220-20. The entire address sequence depicted in FIG. 5 is again repeated for the range of partial memory addresses 512-1023. Again, the entire sequence is repeated until addressing advances to the last ¼MW segment of partial memory 220-20. This last segment is mapped using static memory addresses 3583-4095. The mapping sequence is the same as described above.

From the above, it is seen that the static remap memory 214-10 is addressed by all 2MW of partial memory addresses with a number (512) of partial memory addresses addressing the same static remap memory location. While sequencing through row addresses which are ignored for a partial memory device with column faults, the same location of static remap memory is repeatedly addressed. While this is true, static remap memory 214-10 has sufficient capacity to map 2MW partial memory locations having either column or row faults.

Now, reference will be made to FIGS. 7a through 7d4 to explain the operation of the microprocessing section 216 in performing the dynamic mapping operations upon memory system 20 according to the present invention. The routines of FIG. 7a can be divided into three major groups. The first group of routines termed self-test verifies that the different paths and memory devices of memory system 20 are operational. First of all, when memory system 20 is powered up, this causes section 211 to generate a bus master clear signal which results in the generation of reset signal RESETU000. When reset signal RESETU000 is forced to a binary ZERO, it clears the contents of control register 216-2 of FIG. 7b to ZEROS. This places signal UPMODE000 in a state which places microprocessor section 216 in control of memory system 20. Also, reset signal RESETU000 causes clock generator 216-104 of FIG. 6a to apply a reset signal to CPU 216-100 causing it to initialize its registers to the appropriate values. This includes loading a stack pointer value into static RAM memory 216-14A and 206-14B. CPU 206-100 calls the first test routine SELF-TEST of FIG. 7a.

Figure 7A:
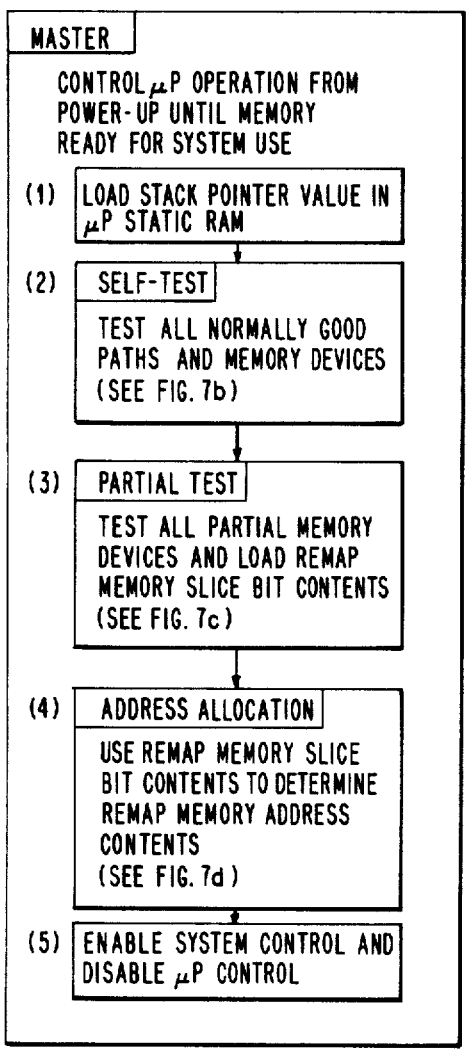

It will be noted that while not discussed, it can be assumed that reset signal RESETU000 is only generated by section 211 in response to a first master clear signal so that section 16 does not repeat the operations depicted of FIG. 7a. Because of the states of signals UPMODE000 and UPMODE110, the system bus to which memory system 20 connects is held in a "wait" condition until microprocessing section 216 completes its tasks.

Figure 7B:
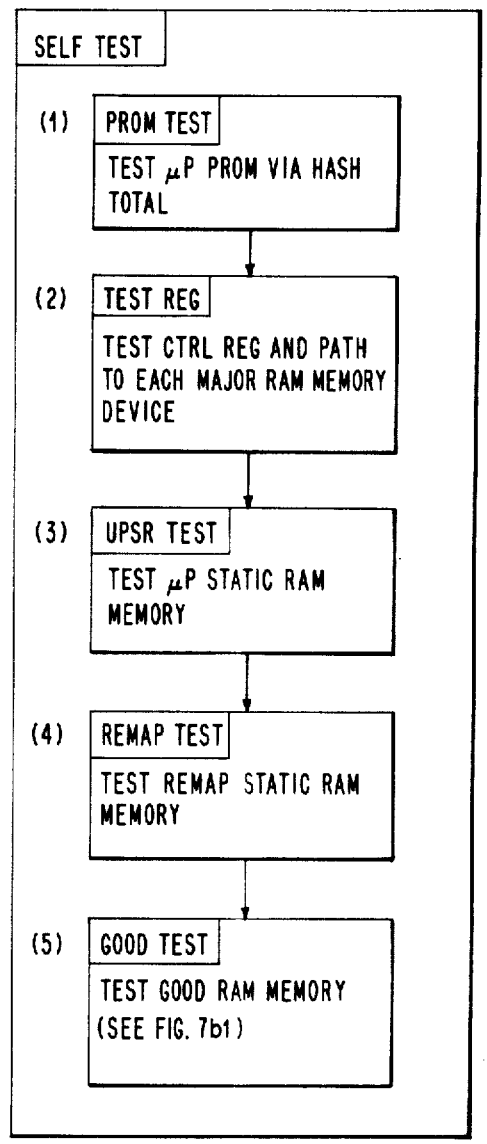

As seen from FIG. 7b, the self-test routines verify the paths and EPROMs 216-12A and 216-12B, control register 216-2 via auxiliary register 216-4, CPU static RAM memories 216-14A and 214-14B, static remap memory 214-10 and good memory device 220-40. If any one of these devices or paths is faulty, the memory system 20 is unable to operate.

As seen from FIG. 7b, the PROMTEST routine verifies the operation of EPROMs 216-12A and 216-12B through the generation of a hash total. This involves CPU 216-100 generating hexadecimal addresses within the range of 07F000 and 07FFFF which are applied via address registers 216-22 to EPROMs 216-12A and 216-12B, in addition to decoder 216-20 of FIG. 2b. The circuits of block 216-200 enable registers 216-22 by generating control address signal CA5. In response to address bits 19 and 22, decoder 216-20 forces the enable CE terminals of PROMs 216-12A and 216-12B to binary ZEROS. This permits the read out of the contents of the addressed locations. CPU 216-100 sums the fields of all of the PROM locations forming a hash total whose value is therafter verified.

The TESTREG routines verify that control register 216-2, microprocessor static RAMs 216-14A and 216-14B, remap memory 214-10 and good memory device 220-40 are operational in a conventional manner. That is, CPU 216-100 writes known data patterns into control register 216-2 and memory locations of such memories and tests the data patterns read therefrom.

In greater detail, CPU 216-200 verifies the operation of control register 216-2 and paths associated therewith by writing a series of test patterns applied via data bus 216-10B into the control register 216-2 by causing the circuits of block 216-200 for force control data signals CD7 and CD9 to binary ONES. CPU 216-100 reads out the patterns written into control register 216-2 via auxiliary register 216-4 and data bus 216-10B by causing the circuits of block 216-200 to force control data signals CD12 and CD7 to binary ZEROS. If any written and read data pattern does not not match identically, CPU 216-100 issues a halt.

To verify the different paths associated with static RAMs 216-14A and 216-14B, CPU 216-100 writes an all ZERO data pattern to one microprocessor RAM location. This is done by applying address signals via address registers 216-22 to RAMs 216-14A and 216-14B, in addition to decoder 216-20. In response to address bits 19 and 22, the decoder forces the CS terminals of RAMs 216-14A and 216-14B to binary ZEROS. At the same time, CPU 216-100 forces control data signal CD14 to an appropriate state (i.e., WE terminal forced to a binary ZERO) enabling the data pattern to be written into the addressed location. CPU-216-100 reads out the written data pattern by forcing control data signals CD14 to the appropriate states (i.e., WE terminal forced to binary ONE, OE terminal forced to a binary ZERO). The patterns are tested and an incorrect pattern causes CPU 216-100 to halt operation. Other desired patterns are written into and read from the same location in the same manner.

Next, CPU 216-100 verifies the different paths associated with remap static memory 214-10 by writing an all ZEROs data pattern into one location of remap memory and reading it out of static remap memory 214-10. To enable CPU 216-100 to perform such read and write operations, it loads control register 216-2 with the appropriate data pattern. This enables the state of control address signal CA1 to condition address multiplexer circuit 209 to apply address signals to the address terminals of static remap memory 214-10. The states of control data signals CD13, derived from address bit 2 which are applied to the CS terminals of static remap RAM 214-10, cause the selection of lower or upper chip banks. Under the control of CPU 216-100, the control logic circuits of 216-200 force control data signals CD8 and CD13 to the appropriate states enabling the known data pattern (all ZEROs or all ONEs) applied via data bus 216-10 to be written into the addressed location (i.e., signals DTRRDL 110 and CSMOS1000=0; signals WRSR01000 and OESR01000/OESR02000=0). CPU 216-100 reads out the known written data pattern by causing the control logic circuits 21-200 to force again control data signals CD8 and CD13 to the appropriate states (i.e., signal DTRRDL110=1, signal CSMOS1000=0; signal WRSR01000=1, signals OESR01000/OESR02000=1) establishing the desired data path. Again, if CPU 216-100 determines that the pattern is incorrect, it halts operation.

In order to test each of the paths associated with each good memory device bit group, CPU 216-100 loads control register 216-2 with the appropriate pattern for enabling writing into good memory 220-40. Next, static remap memory 214-10 is loaded with an appropriate memory address and the correct slice bit pattern (e.g. address field=0 and slice bit field=all 1's). Next, CPU 216-100 loads control register 216-2 with a data pattern for enabling good memory device 220-40. CPU 216-100 generates a memory address applied via the address path to static remap memory 214-10 and to good memory device 220-40. The slice bit field read out causes the circuits of sections 208 and 214 to force read/write control signals MLRDGD010 through MCRDG010 to the appropriate states during a write operation and data control signals CD1 through CD4 to the appropriate states during a read operation.

CPU 216-100 writes a known data pattern into all groups or slices of each good memory 256K location. Under control of CPU 216-200, control address signals CA1 and CA3 are forced to binary ONES and control data signals CD7 and CD10 to the appropriate states (i.e., signal DTRRDL000=0, signal DIRENB100=0, signal UPMODE000=0). This establishes the desired address and data paths for the write operation. CPU 216-100 follows the write operation by a read operation for read out of the written data pattern from the good memory location. This is accomplished by forcing control data signals CD1 and 2 and CD3 and 4 to the appropriate states (i.e., signals SLICE1100, SLICE2100 and SLICE3100=0, and signals SLICE1010, SLICE2010 and SLICE3010=1). Next, CPU 216-100 now reads the 16 data bits of the location data field via data registers 216-306 and 216-308 by forcing CD6 to an appropriate state (i.e., signal RSEL02000=0) and checks them for errors. CPU 216-100 reads the six check bit field of the same location via data register 216-310 by forcing CD5 to an appropriate state (i.e., signal RSEL03000=0) and checks them for errors. If the contents read from the good memory location in either case are not correct, CPU 216-100 halts operation.

As seen from FIG. 7b, upon verifying the paths to and from the memories, CPU 216-100 then tests each of the locations of static RAM memory 216-12A and 216-12B, remap static memory 214-10 and good memory device 220-40. Again, this is done in a conventional manner by writing and reading known data patterns into and from the memory locations in the manner discussed above. For example, routine UPSRTEST writes and reads all 0's and all 1's data patterns into location 0 to location 2K-reserved stack area locations of the static RAM memory 216-12A and 216-12B.

In a similar fashion, routine REMAPTEST writes and reads all 0's and all 1's data patterns into location 0 to location 4K of the remap static memory 214-10. Again, CPU 216-100 loads control register 216-2 with an appropriate pattern which enables static remap memory 214-10 for read and write operations.

Since only the first 12 bit positions of each location are used, CPU 216-100 tests only these bits. During such testing, the memory address applied to remap memory 214-10 is incremented so that each remap memory location is only accessed once. Address incrementing is carried out as a function of the type of partial memory RAM chips used according to FIG. 5.

In greater detail, since partial memory device 220-20 can be constructed from 256K RAM chips having defective rows or columns, CPU-216-100 issues a command to read the contents of auxiliary register 216-4. That is, it forces control data signal CD12 to the appropriate state (i.e., signal RSEL01000=0) which allows it to sample the state of row/column select signal RCSELT010 from jumper network 207-12 of FIG. 2b. Thereafter, CPU 216-100 increments the partial memory address as a function of the state of signal RCSELT010.

More specifically, if signal RCSELT010 is a binary ZERO indicating that partial memory 220-20 contains row faults, starting at location 2MW, CPU 216-100 increments by one address bits 14–22 through 512 locations (i.e., until the value 511 is reached). At that time, the upper bits 2-4 are incremented by the amount of 256K locations jumping the address to the start of the next partial chip system row address boundary located at 2¼MW (i.e., hexadecimal address 3FFFF). Again, CPU 216-100 successively increments the address through another 512 locations. This continues until all 4K locations of remap memory 214-10 have been accessed.

However, if signal RCSELT010 is a binary ONE indicating that partial memory 220-20 contains column faults, starting at location 2MW, CPU 216-100 increments the memory address by the amount 512 each time until all 4K locations of remap memory 214-10 have been accessed. Thus, CPU 216-100 generates the desired sequences of memory addresses according to FIG. 5 for addressing each remap memory location only once for a partial memory device with row or column faults.

As seen from FIG. 7b, the last self-test performed by CPU 216-100 corresponds to routine GOODTEST shown in greater detail in FIG. 7b1. Using this routine, CPU 216-100 tests each of the 256K RAM good memory using known patterns. That is, first CPU 216-100 loads control register 216-2 with the pattern which enables remap memory 214-10 for read/write operations.

Next, CPU 216-100 loads remap memory locations 0 through 511 with sequential addresses starting with 0 and sets the first two slice bits to ONES. The next 512 locations (512-1023) are loaded with sequential addresses starting with 0, and the third slice bit of each location is set to a ONE.

Next, CPU 216-100 loads control register 216-2 with a pattern which enables good memory device 220-40 for read/write operations. Thereafter, locations 0-256K of good memory are addressed (i.e., 2MW to 2¼MW microprocessor address range) and known data patterns are written into and read from the first two groups or slices of bits of these locations. Next, locations 0-256K of good memory are addressed (i.e., 2¼MW to 2½MW microprocessor address range) and known check bit initialization patterns are written into and read from the third group or slice of bits of these locations. In each case, any incorrect data pattern causes a halt in operation. At the completion of routine GOODTEST, CPU 216-100 sets the slice bit and address fields of all remap memory locations to ZEROS. This enables read out of partial memory locations.

As seen from FIG. 7a, CPU 216-100 begins execution of a second group of routines. These routines map static remap memory 214-10 to reflect the testing results of each slice or group of bit locations of partial memory device 220-20. As seen from FIG. 7c, CPU 216-100 references routine REM3 shown in greater detail in FIG. 7c1. This causes CPU 216-100 to load control register 216-2 with a pattern which enables partial memory device 220-20 for read and write operations.

Starting with location 0, CPU 216-100 writes the check bit initialization pattern into the third group or slice of the two megawords of partial memory locations addressed by address signals applied via address out registers of block 216-22, address multiplexer circuit 209 and address registers of block 207-10. At that time, control address signals CA1, CA2 and CA5 are forced to the appropriate states (i.e., signal CSBULK200=0, signal UPADLE100=1) thereby establishing the required address path. Additionally, control data signals CD7 and CD10 are forced to the appropriate states (i.e., signal DTRRDL000=0, signal UPMODE000=0) which establishes the data path for writing the check bit initialization pattern into the third group of partial memory locations. During a read cycle of operation, CPU 216-100 reads out the data pattern and checks it. This is accomplished using the same address path but a different data path established by forcing control data signals CD5 and CD7 to the appropriate states (i.e., signal DTRRDL000=1), signal RSEL03000=0). The test is repeated with the same pattern. If any error is found, CPU 216-100 references routine DOREM3 which writes a binary ONE into the third bit position of the slice bit field portion of the addressed static remap memory location. CPU 216-100 establishes the desired data path by forcing control data signals CD8 and CD13 to the appropriate states (i.e., signal signal CSMOS1000=0, signal WRSR01000=0, signal OESR01000/OESR02000=1).

Figure 7C:
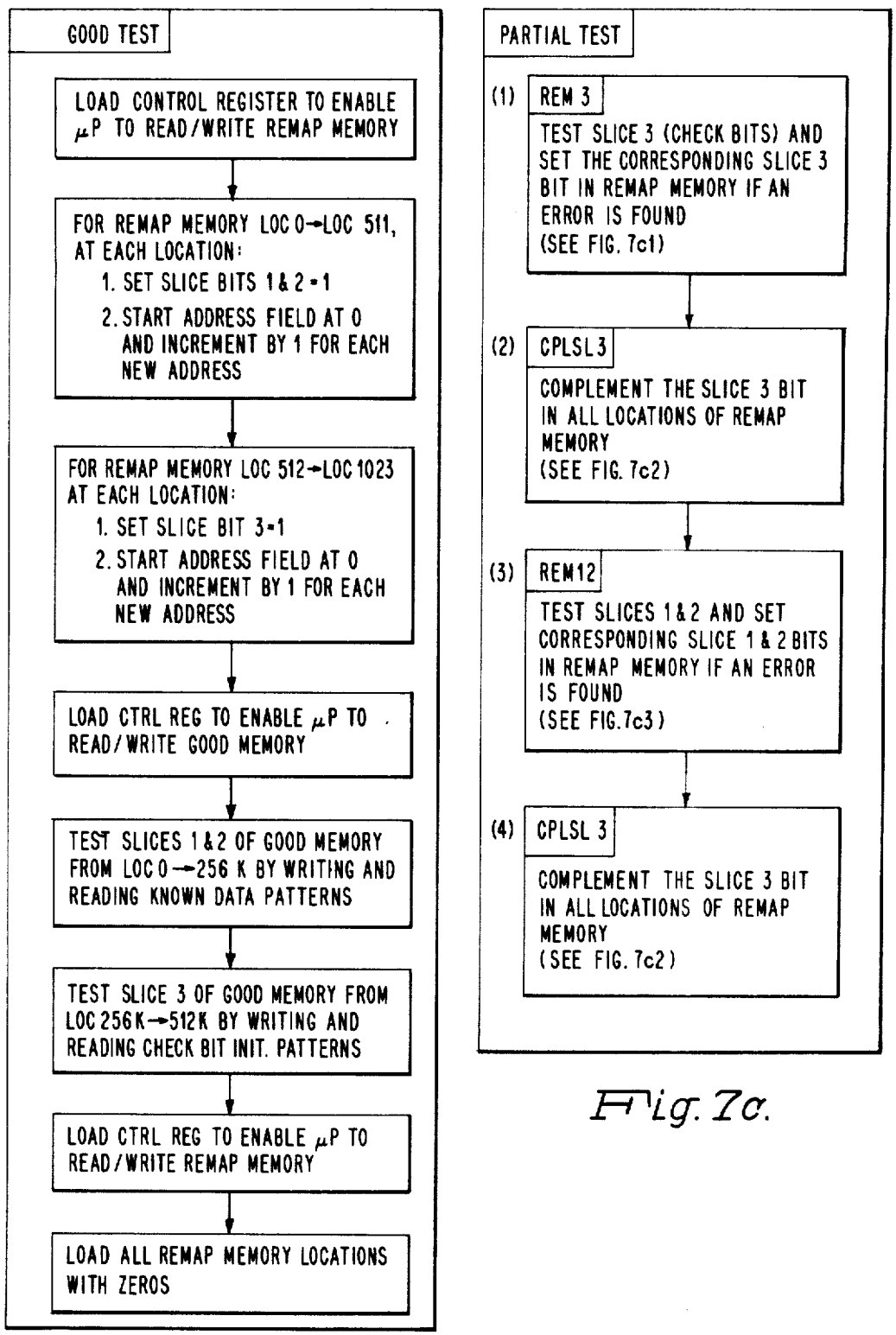

As seen from FIG. 7c1, testing is repeated starting at location two megawords. When routine REM3 is completed, CPU 216-100 references routine CPLSL3 of FIG. 7c2. This causes CPU 216-100 to determine the type of partial memory chips used as discussed above and then load control register 216-2 with a pattern which enables static remap memory 214-10 for read/write operations. Starting with location 0 and continuing to location 4K, CPU 216-100 reads each pattern and after determining the state of the third slice bit, it complements its state. The new pattern is then written back into the addressed location. By complementing the state of slice bit 3, the check bit initialization pattern previously written into the third group of bits or slice of that location is retained when testing good slices 1 and 2 of partially good memory device 220-20.

At the completion of this routine, CPU 216-100 begins testing the first and second groups of partial memory locations by referencing routine REM12 of FIG. 7c3. Testing is carried out in the same manner with the exception that CPU 216-100 forces data control signal CD6 to the appropriate state rather than CD5. In the case of an error, CPU 216-100 reference routine DOREM12 which sets slice bit 1 or 2 or both of the slice bit field of the addressed static remap memory location. At the completion of routine REM12, CPU 216-100 again references routine CPLSL3 which recomplements the state of slice bit 3 in each location so that it indicates the correct state according to previous testing.

It is assumed that upon completing the testing of partial memory 220-20, the slice bit fields have the patterns shown in FIG. 4. At this time, the address fields are all ZEROS due to prior initialization.

FIG. 4 shows where all the defects are from a row or column perspective and, hence, serves as a "slice bit map". The hexadecimal addresses designate physical column address portions of the input addresses, in the case of column faults and physical row address portions of the input memory addresses in the case of row faults.

Figure 7D:
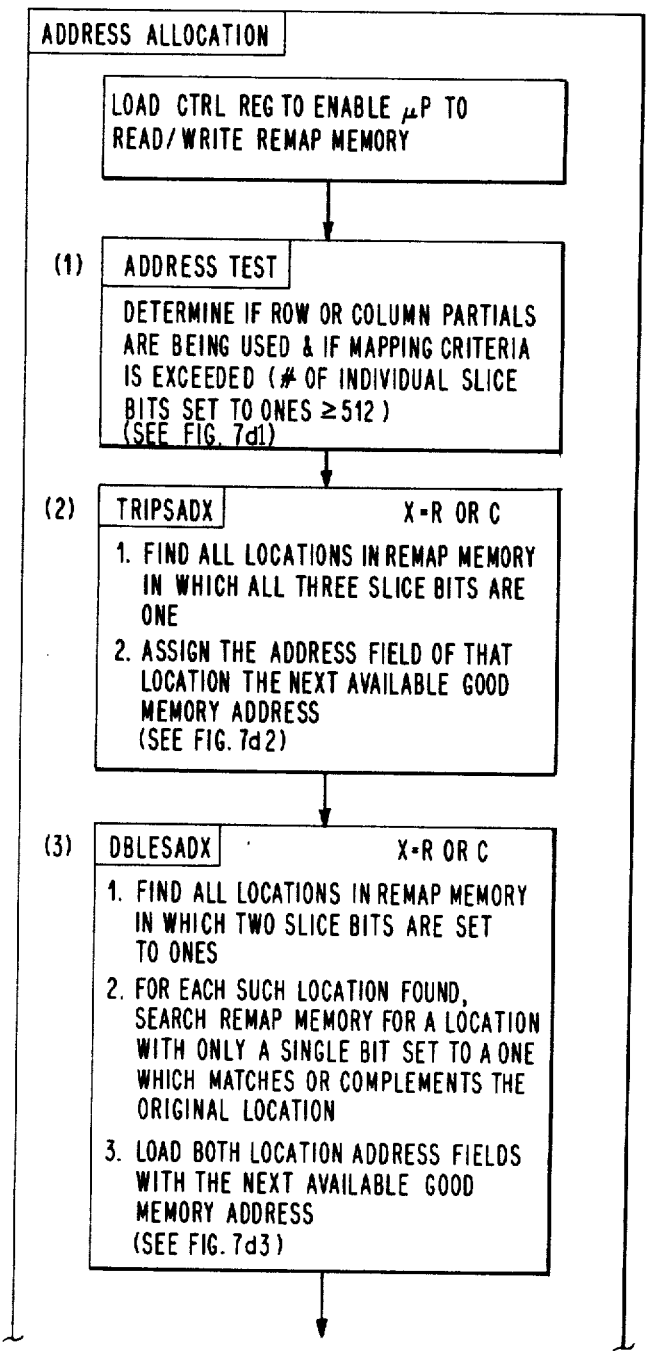
Figure 7D:
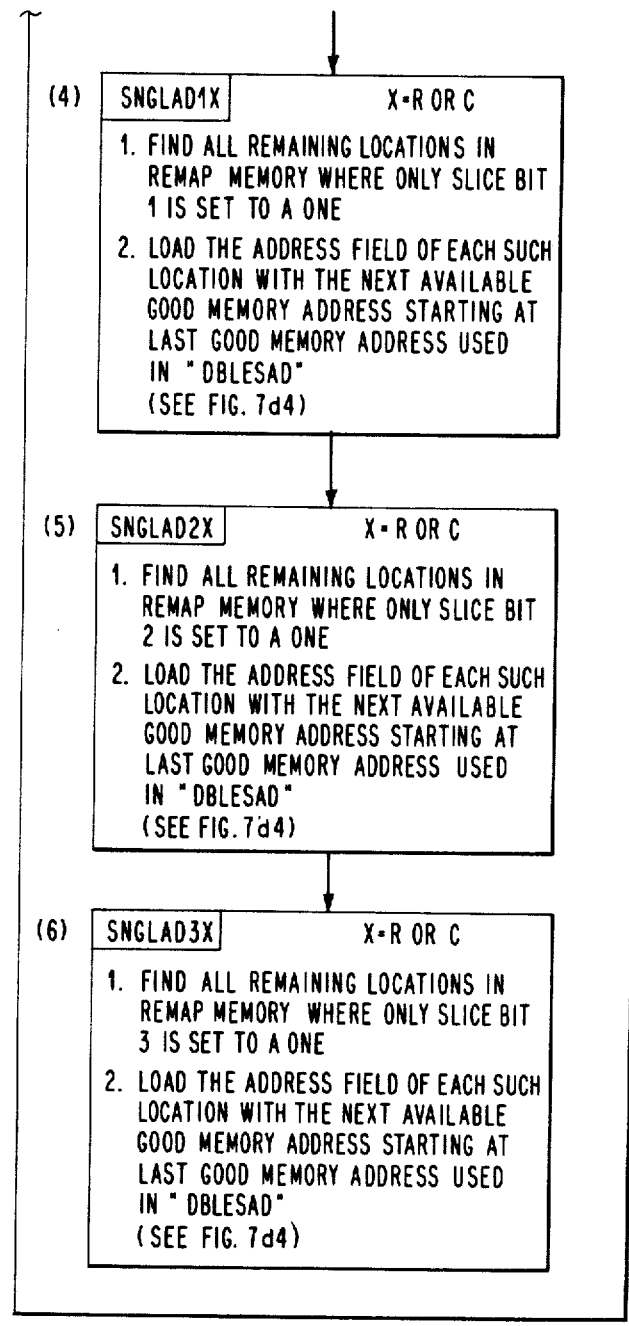

CPU 216-100 begins its execution of the address allocation routines of FIG. 7d during which it interprets the contents of the "slice bit map" and fills in the address field values. As seen from FIG. 7d, CPU 216-100 loads control register, 216-2 with a pattern which enables remap memory 214-10 to perform read/write operations. Next, it references routine ADDRESSTEST of FIG. 7d1. This routine determines the type of faulty chips being used in partial memory device 220-20 and whether or not the established criteria have been exceeded.

In greater detail, as seen from FIG. 7d1, CPU 216-100 reads the contents of control register 216-4. It then tests the state of row/column select signal RCSELT010. As a function of this signal, it selects the series of routines used for address allocation starting with routine TRIPSADR (row faults) or routine TRIPSADC (column faults). Except for address incrementing, both series of routines are the same.

Next, CPU 216-100 verifies that the number of faults within each group or slice of bits does not exceed the established criteria of 512 (i.e., (8 per chip × 8 chips per slice × 8 system rows=512). As seen from FIG. 7d1, it does this using three counters CNTR1, CNTR2 and CNTR3 which count or add up the number of "ONES" in each of the three slice bit positions (i.e., slice bit 1, 2 and 3) of the slice bit fields. During this operation, the address applied to remap memory 214-10 is incremented so that each location is accessed only once. The final contents of each counter are then tested to make certain that all store a value which is less or equal to 512. Assuming that they do, CPU 216-100 next begins routine TRIPSADX.

According to the invention, CPU 216-100 searches the "slice bit map" for places where three failures/defects coexist (slices 1, 2 and 3) starting with location 0 under the control of routine TRIPSADX.

As seen from FIG. 7da, CPU 216-100 clears a register CNTR0 to ZEROS and uses it to keep track of the good address values as they are assigned and written into static remap memory 214-10 of FIG. 4. CPU 216-100 first addresses static remap memory 214-10 and reads out the contents of location 0. The address and data paths are established in the manner previously described. In FIG. 4, since only slice bits 1 and 3 within the slice bit field are set to ONES, CPU 216-100 increments the address by one while CNTR0 remains at ZERO. Incrementing continues until CPU 216-100 reads out the contents of location 006 of static remap memory 214-10.

Since this location has an all ONES slice bit field, CPU 216-100 writes the address contents of CNTR0 into location 006 as indicated in FIG. 4. This completes the assignment of the first address labeled as step 1 of FIG. 4. At that time, CPU 216-100 increments by one the address contents of CNTR0. CPU 216-100 continues addressing static remap memory 214-10 until it reads out the contents of location D. CPU 216-100 assigns octal address 001 by writing the contents of CNTR0 into location D. This completes the assignment of the second address labeled as step 2 in FIG. 4. It then increments CNTR0 by 1.

CPU 216-100 continues to search for triple defects and determines there are no more. It preserves the address contents of CNTR0 and sequences to routine DBLESADX of FIG. 7d3. During the execution of this routine, CPU 216-100 searches for double fault combinations in the different combinations of bit positions (i.e., slice bits 1 and 2, 1 and 3, and 2 and 3) of the slice bit fields of static remap memory 214-10 using remap address counters A, A1, A2 and A3. Starting with location 0, CPU 216-100 reads out location 0 and locates the first double fault combination in location 0. It then fetches CNTR0 and writes its hexadecimal address contents 002 into location 0 which is specified by the contents of address counter A. This completes the first part of assigning the third address labeled as step 3 in FIG. 4.

Next, CPU 216-100 references routine GETSL2X of FIG. 7d3.1. This routine testing the second bit position or slice bit 2 of each slice bit field to locate a faulty partial memory location which can be assigned the same address. Starting again with location 0 and using address counter A2, CPU 216-100 searches through the slice bit map until it finds location 5. Then CPU 216-100 returns to routine DBLESADX which assigns this location, address 002 by writing the contents of CNTR0 into location 5 which is defined by the contents of address counter A2 as shown. This completes the assignment of the third address labeled as step 3 in FIG. 4. It then increments address counter A2 and CTNR0.

Next, address counter A is incremented and CPU 216-100 returns to remap memory location 1. It continues its search for double fault combinations in the slice bit fields. It finds the next double fault combination location 3. It fetches CNTR0 and writes its address contents 003 into location 3 which is specified by the contents of address counter A. This completes the first part of assigning the fourth address labeled as step 4 in FIG. 4.

Next, CPU 216-100 references routine GETSL3X of FIG. 7d3.1. This routine tests the third bit position of slice bit 3 of each slice bit field to locate a matching faulty partial memory location which can be assigned the same address. CPU 216-100 locates such a fault in location B. Then CPU 216-100 returns to routine DBLESADX which assigns this location, address 003 by writing the address contents 003 of CNTR0 into location B which is defined by the contents of address counter A3. This completes the assignment of the fourth address labeled as step 4 in FIG. 4. CPU 216-100 then increments address counter A3 and CTNR0.

As seen in FIG. 4, CPU 216-100 continues its search for double fault combinations and locates the next such fault in location 9. It writes the hexadecimal address contents 004 of CNTR0 into the location whose address is specified by address counter A. This completes the first part of the assignment of the fifth address indicated as step 5. Next, CPU 216-100 references routine GETSL2X for locating another single fault in slice bit 2. CPU 216-100 finds one at location F and writes the address contents 004 of CNTR0 into the location whose addressed specified by address counter A2. Again, CNTR0 and address counter A2 are incremented. This completes the assignment of the fifth address indicated as step 5 in FIG. 4.

Next, CPU 216-100 returns to the last double fault address 9 and continues its search. It finds the next double fault combination at location 10. CPU 216-100 assigns it address 005 by writing the address contents of CNTR0 into the location specified by address counter A. This completes the first part of the sixth address assignment indicated as step 6 in FIG. 4. Next, CPU 216-100 references routine GETSL1X of FIG. 7d3.1 to search for another single fault of the type which can be combined with the double fault just located. As a result of searching for a single fault in slice bit 1, CPU 216-100 finds one at location 1. It writes the address contents 005 into the location whose address is specified by address counter A1. This completes the assignment of the fifth address indicated as step 5 in FIG. 4. Again, it increments CNTR0 and address counter A1.

Next, CPU 216-100 returns to the last address 10 and continues its search for double faults of the type mentioned. It determines there are no more. At this point, CPU 216-100 has assigned all triple faults and double faults with matching single faults.

Next, CPU 216-100 begins execution of the series of routines starting with routine SGLAD1X of FIG. 7d4 to assign good memory addresses to those remaining partial memory locations with single faults. This routine locates the first single fault in slice bit 1 of the slice bit fields which is by itself and has not been assigned. The CPU 216-100 starts at location A1 and, as seen from FIG. 4, the first such fault is found at location A. CPU 216-100 assigns this location hexadecimal address 006 by writing the address contents of CNTR1 which equal CNTR0 into the location whose address is specified by address counter A1. This completes step 7 of FIG. 4.

As seen from FIG. 7d4, CPU 216-100 increments CNTR1 and address counter A1. It continues its search of slice bit 1 locations and finds the next unassigned single fault at location 16. CPU assigns this location hexadecimal address 007 by writing the contents of CNTR1 into the location whose address is specified by address counter A1. Again, CPU 216-100 increments CNTR1 and address counter A1. This completes step 8 of FIG. 4.

CPU 216-100 continues its search for unassigned single faults in slice bit 1 and finds there are no more. As seen from FIG. 7d, it next references routine SNGLAD2X of FIG. 7d4. It begins searching for single faults in slice bit 2, from the location specified by the address contained in address counter A2, which is by itself and has not been assigned. As seen from FIG. 4, the first such fault is found at location 17. CPU 216-100 assigns this location hexadecimal address 006 by writing the contents of CNTR2 into the location specified by address counter A2. This completes step 9 of FIG. 4. As seen from FIG. 7d4, CPU 216-100 increments CNTR2 and address counter A2. It continues its search of slice bit 2 locations and finds there are no more single faults.

As seen from FIG. 7d, CPU 216-100 references routine SNGLAD3X of FIG. 7d4. It begins searching for single faults in slice bit 3, from the location specified by the address contained in address counter A3, which by itself has not been assigned. As seen from FIG. 4, the first such fault is found at location 12. CPU 216-100 assigns this location hexadecimal address 006 by writing the contents of CNTR3 into the location specified by address counter A3. This completes step 10 of FIG. 4. As seen from FIG. 7d4, CPU 216-100 increments CNTR3 and address counter A3. It continues its search of slice bit 3 locations and finds another single fault at location 14. CPU 216-100 assigns this location hexadecimal address 007 by writing the contents of CNTR3 into the location specified by address counter A3. This completes step 11 of FIG. 4.

As seen from FIG. 7d4, CPU 216-100 increments CNTR3 and address counter A3 and continues its search. However, as seen from FIG. 4, it finds no more faults. This completes the address allocation process. At such completion, it is seen that all faults are assigned locations at the bottom portion of good memory device 220-40.

It will be appreciated that the allocation of addresses to locations containing only single faults can be handled in alternative ways. For example, CPU 216-100 can operate to search the first, second and third groups or slices in succession for only single faults. Upon locating a single fault in each such group or slice, CPU 216-100 loads a next column address contained at CNTR0. Accordingly, CPU 216-100 increments by one the address contents CNTR0 only after matching single faults in all three groups or slices have been assigned the same column address. Other ways of performing the allocation will occur to those skilled in the art.

Summarizing the above, it is seen that CPU 216-100 tests its own EPROM memory by doing a hash total check to make certain the routines are correct. It tests its own memory in which it places the required table information (e.g. data patterns, address counters A, A1, A2, A3, counters CNTR0 through CNTR3, etc.). Then it tests static remap memory 214-10 and leaves its fields with all ZEROS. It then tests good memory device 220-40 which is followed by testing partial memory device 220-20 at which time it generates the "slice bit map". Both good and partial memories are now left in the proper initialization state for proper operation of the EDAC decoder circuits 206-16 logic. Additionally, CPU 216-100 verifies the number of faults within each group/slice by adding up the number of "ONES" in the different bit positions of the slice bit fields. It makes certain that the value does not exceed the established criteria.

Next, CPU 216-100 fills in the address fields of the slice bit map. Starting at the bottom, it tests for triple faults and assigns each such type of fault the next available address stored in CNTR0. Next, it checks for each combination of double faults and a matching type of single fault to complete the assignment of the next available addresses in good memory device 220-40. It then compacts all the individual single faults into the next available locations in good memory device 220-40 until all the faults in the slice bit map have been assigned addresses. Because of the above, there will be unassigned good memory addresses which are available in the event they are later required.

As seen from FIG. 7a, CPU 216-100 returns to the master routine. this routine loads control register 216-2 with a pattern which forces mode signal UPMODE110 to a binary ZERO state. This conditions the address multiplexer circuits of block 209 to select the system bus which connects to circuits 213 as the source of address signals. Now, memory system 20 is read to process memory commands.

It will be appreciated that while CPU 216-100 performed the operations set forth in the flow charts of FIGS. 7a through 7d4 during power-up, they could also be performed at other times, such as upon the detection of certain types of error conditions, or upon the issuance of a specific memory type of memory command (e.g. diagnostic type command).

It will be obvious to those skilled in the art that many changes may be made to the remap method and apparatus of the present invention without departing from its teachings. For example, different types of microprocessors may be used to carry out the remapping method of the present invention. Also, the criteria of the number of row or column faults may be increased or decreased. Similarly, the size and organization of the memory system may be changed.

To prevent undue burdening the description with matter with the ken of those skilled in the art, a block diagram approach has been followed, with a detailed functional description of each block and specific identification of the circuits it represents. The individual engineer is free to select elements and components such as flip-flop circuits, shift registers, microprocessors, etc. from the individual's own background or available standard references as given herein.

It will also be noted that the sequences of particular instructions were not disclosed herein since the engineer is free to select alternate sequences for accomplishing the operations shown. Moreover, it will be obvious to those skilled in the art what instructions of a given microprocessor instruciton set may be used. For example, incrementing may be carried out by an increment instruction using the CPU's arithmetic and logic unit. While the various types of counters utilized by the CPU may take the form of microprocessor memory locations, it may be obvious that CPU internal register storage may also be used for quicker access.

For further details and insight into techniques and deriving such instructions and for additional background information, reference may be made to "The 8086 Family User's Manual by Intel Corporation, Copyright 1979.

While in accordance with the provisions and statutes there has been illustrated and described the best form of the invention, certain changes may be made without departing from the spirit of the invention as set forth in the appended claims and that in some cases, certain features of the invention may be used to advantage without a corresponding use of other features.

What is claimed is:

1. A remapping system for use with an addressable partially good memory including a plurality of partially good RAM chips each having a number of internal rows and columns of bit locations containing a number of randomly distributed faults, said plurality of partially good chips being organized into a number of system rows and columns, said columns being organized into a small number of groups of bits, and an addressable good memory having a plurality of defect-free RAM chips, each chip being organized internally into said number of internal rows and columns, said plurality of chips being organized into at least one system row and into a number of system columns, said number of system columns being organized into the same number of groups as said partially good memory, said remapping system comprising:

an addressable static RAM memory having a plurality of locations corresponding in number to at least the number of system rows times the number of internal rows or columns whichever is larger, each location having a plurality of column address bit locations and a plurality of slice bit locations corresponding in number to said number of groups and each associated with a different one of said number of groups; and, processing means connected to each of said memories, said processing means for addressing each of said static memory locations and forcing each of said plurality of slice bit locations to a first state when the group of bit locations associated therewith in a corresponding one of said partially good memory locations is detected as being faulty; and, said processing means including means for assigning column addresses identifying locations in said good memory in a predetermined manner according to category of fault to each static memory location which contains at least one slice bit location in said first state to maximize the use of each of said good memory groups of bit locations.

2. The system of claim 1 wherein said processing means operates to assign a next sequential column address to each fault of a first category designated by each static memory location in which said plurality of slice bit locations are in said first state indicating that all of said number of groups of bits of the corresponding partially good memory location are faulty, said processing means upon locating all of said first category of faults to continue assigning said next sequential column address to each fault in a second category corresponding to a multiple fault and a matching single fault designated by combinations of partially good memory locations in which all of the combined static memory slice bit locations are in said first state and said processing means upon locating all of said second category of faults to continue assigning said next sequential column address to each fault in a third category corresponding to matching single faults designated by a plurality of matching partially good memory locations in which the combined static memory slice bit locations are in said first state thereby minimizing the number of said good memory locations required for the operation of a defect-free memory.

3. The system of claim 2 wherein said number of said groups is three and said processing means includes means for incrementing said next column address after said next column address is written into said single static memory location for each triple fault and said next column address is written into the last of said two static memory locations.

4. The system of claim 3 wherein said processing means increments a first copy of said next column address each time said next column address is written into one of static memory locations having only single faults in a first one of said groups of bits.

5. The system of claim 4 wherein said processing means increments a second copy of said next column address each time said next column address is written into one of said static memory locations having only a single fault in a second one of said groups of bits.

6. The system of claim 5 wherein said processing means increments a third copy of said next column address each time said next column address is written into one of said static memory locations having only a single fault in a third one of said groups of bits so that all three static memory locations having matching single faults contain the same column address.

7. The system of claim 3 wherein said remapping system further includes:

addressing means coupled to said partially good memory, said good memory and to said static memory for applying row and column address portions of a memory address received from said processing means;

network switching means coupled to said static memory, to said addressing means and to said good memory, said network switching means being connected to selectively apply said row and column address portions of said memory address to said static memory and to said good memory as a function of the type of faulty chips used in said partially good memory, said network switching means including indicator circuit connected to generate a row/column signals whose state indicates said type of faulty chip; and, said processing means including control register coupled to said indicator circuit, said processing means being conditioned by the state of said row/column signal read from said control register to condition said incrementing means to increment said row and column address portions in a predetermined manner for conditioning said addressing means to address each static memory location only once.

8. The system of claim 7 wherein when said row/column signal is in a first state indicating column type faults, said processing means is operative to condition said incrementing means to increment by a predetermined amount said memory address for addressing each static memory location only once until all of said locations have been addressed.

9. The system of claim 7 wherein when said row/column signal is in a second state indicating row type faults, said processing means to increment by one only said row address portion of said memory address until a predetermined number of said locations have been addressed, said processing means then incrementing said memory address by a predetermined amount for addressing a next system row of chips by again incrementing said row address portion by one for addressing each static location only once.

10. The system of claim 7 wherein said addressing means further includes multiplexer circuit means having first and second sets of inputs connected to said processing means and to an input address bus respectively for receiving memory addresses therefrom, a set of outputs connected to said network switching means, said good memory and said partially good memory, and a control input connected to said control register, said processing means being operative during the powering up of said system to load said control register with a predetermined pattern, said control input being conditioned by said pattern to apply only to said memory addresses received from said processing means to said set of outputs of said multiplexer circuit.

11. The system of claim 7 wherein said addressing means further includes multiplexer circuit means having first and second sets of inputs connected to said processing means and to an input address bus respectively for receiving memory addresses therefrom, a set of outputs connected to said network switching means, said good memory and said partially good memory, and a control input connected to said control register, said processing means being operative upon completing the assignment of said column addresses to load said control register with a predetermined pattern, said control input being conditioned by said predetermined pattern to apply only said memory addresses received from said input address bus for normal processing of memory commands.

12. The remap memory system of claim 1 wherein said memory system further includes:

error detection and correction circuits coupled to said partially good and good memories for detecting and correcting errors in the information read from those groups of bit locations of said partially good and good memories accessed during a memory cycle of operation; and wherein said processing means is coupled to said partially good and good memories for receiving said information in uncorrected form so as to detect and record in said static remap memory all of said faults in said partially good memory locations for assigning good memory locations improving said memory system's tolerance to soft error conditions.

13. A remap system for enabling the use of a memory unit which comprises an addressable partially good memory, including a plurality of partially good RAM chips, each partially good chip having m internal rows and n internal columns of bit locations containing a predefined randomly distributed small number of row or column faults, said plurality of partially good chips being organized into X system rows and Y system columns, said Y columns of chips being organized into a small number of groups, each group providing one different predetermined portion of said number of word locations and, an addressable good memory having a plurality of defect-free chips, each good chip being organized internally into said m rows and n columns of bit locations, said plurality of good chips being organized into at least one system row and said Y system columns, said Y columns of chips being organized into said small number of groups, each group for providing assigned predetermined portions of said number of word locations, said remapping system comprising:

an addressable static RAM memory having a plurality of locations corresponding in number to X system rows times m rows or n columns whichever is larger, each location having a plurality of column address bit locations and a plurality of slice bit locations corresponding in number to said number of groups and each being associated with a different one of said number of groups; and, a microprocessing unit coupled to said memory unit and to said static remap memory, said microprocessing unit including a programmable read only memory having a plurality of memory locations for storing a number of routine sequences used for initializing said memory unit, said microprocessing unit being conditioned during the initializing of said memory unit to reference one of said routine sequences for testing said partially good memory for faults, said microprocessing unit being conditioned by said first one of said routine sequences to address each of said static memory locations and force corresponding ones of said slice bit locations to a first state when the group of partially good bit locations associated therewith is detected to be faulty so as to establish a slice bit map.

14. The remap system of claim 13 wherein said microprocessing unit includes address storage means, said microprocessing unit being operative upon completing said slice bit map to reference another one of said routine sequences for assigning column addresses using said address storage means in a predetermined manner according to category of fault to each static memory location which has at least one slice bit location in said first state to maximize the use of each of said good groups of bit locations.

15. The remap system of claim 13 wherein m, n, x and y integers, and wherein m equals n and said number of row or column faults is small as compared to said m internal rows and n internal columns of said partially good RAM chips.

16. The system of claim 14 wherein said microprocessing unit is conditioned by said another one of said routine sequences to assign a next sequential column address to each fault of a first category designated by each static memory location in which said plurality of slice bit locations are in said first state indicating that all of said number of groups of bits of the corresponding partially good memory locations are faulty, said another routine sequence conditioning said microprocessing unit upon locating all of said first category of faults to continue assigning said next sequential column address to each fault in a second category corresponding to a multiple fault and a matching single fault designated by combinations of partially good memory locations in which all of the combined static memory slice bit locations are in said first state and upon locating all of said second category of faults, said microprocessing unit being conditioned to continue assigning said next sequential column address to each fault in a third category corresponding to matching single faults designated by a plurality of matching partially good memory locations in which are combined static memory slice bit locations are in said first state thereby minimizing the number of said good memory locations required for the operation of said memory unit.

17. The system of claim 16 wherein said number of said groups is three and said microprocessing unit includes means for incrementing said next column address after said next column address is written into said single static memory location for each triple fault and said next column address is written into the last of said two static memory locations.

18. The system of claim 17 wherein said processing means increments a first copy of said next column address stored in said address storage means each time said next column address is written into one of static memory locations having only single faults in a first one of said groups of bits.

19. The system of claim 18 wherein said microprocessing unit increments a second copy of said next column address stored in said address storage means each time said next column address is written into one of said static memory locations having only a single fault in a second one of said groups of bits.

20. The system of claim 19 wherein said microprocessing unit increments a third copy of said next column address stored in said address storage means each time said next column address is written into one of said static memory locations having only a single faullt in a third one of said group of bits so that all three static memory locations having matching single faults contain the same column address.

21. The system of claim 14 wherein said remapping system further includes:

addressing means coupled to each of said memories for applying row and column address portions of a memory address received from said microprocessing unit;

network switching means coupled to said static memory, to said addressing means and to said good memory, said network switching means being connected to selectively apply said row and column address portions of said memory address to said static memory and to said good memory as a function of the type of faulty chips used in said partially good memory, said network switching means including indicator circuit connected to generate a row/column signals whose state indicates said type of faulty chip; and wherein said another one of said routine sequences includes first and second groups of routine sequences, said microprocessing unit further including register means coupled to said indicator circuit, said microprocessing unit being conditioned by said another one of said routine sequences to select between said first and second groups of routine sequences as a function of the state of said row/column signal read from said register means, said selected groups of routines conditioning said microprocessing unit to increment said memory address in a predetermined manner for conditioning said addressing means to address each static memory location only once.

22. The system of claim 21 wherein when said row/column signal is in a first state indicating column type faults said microprocessing unit is conditioned by said first group of routine sequences to increment by a predetermined amount said memory address for addressing each static memory location only once until all of said locations have been addressed.

23. The system of claim 21 wherein when said row/column signal is in a second state indicating row type faults, said microprocessing unit is conditioned by said second group of routine sequences to increment by one only said row address portion of said memory address until a predetermined number of said locations have been addressed, said processing means then incrementing said memory address by a predetermined amount for addressing a next system row of chips by again incrementing said row address portion by one.

24. The system of claim 21 wherein said addressing means further includes multiplexer circuit means having first and second sets of inputs connected to said microprocessing unit and to an input address bus respectively for receiving memory addresses therefrom, a set of outputs connected to said network switching means, said good memory and said partially good memory, and a control input connected to said register means, said microprocessing unit being operative during the powering up of said memory system to load said register means with a predetermined pattern, said control input being conditioned by said pattern to apply only to said memory addresses received from said microprocessing unit to said set of outputs of said multiplexer circuit.

25. The system of claim 21 wherein said addressing means further includes multiplexer circuit means having first and second sets of inputs connected to said processing means and to an input bus respectively for receiving memory addresses therefrom, a set of outputs connected to said network switching means, said good memory and said partially good memory, and a control input connected to said register means, said microprocessing unit being operative upon completing the assignment of said column addresses to load said register means with a predetermined pattern, said control input being conditioned by said predetermined pattern to apply only said memory addresses received from said input address bus for normal processing of memory commands following the initialization of said memory system.

26. The remap memory system of claim 13 wherein said memory unit couples to error detection and correction circuits for detecting and correcting errors in the information read from those groups of bit locations of said partially good and good memories accessed during a memory cycle of operation; and wherein said microprocessing unit is coupled to said partially good and good memories for receiving said information in uncorrected form so as to detect and record in said static remap memory all of said faults in said partially good memory locations for assigning good memory locations improving said memory unit's tolerance to soft error conditions.

27. A method of remapping an addressable partially good memory including a plurality of partially good RAM chips, each having a number of internal rows and columns of bit locations containing a number of randomly distributed row or column faults which operates with an addressable good memory having a plurality of defect-free RAM chips, each chip being organized internally into said number of internal rows and columns, said plurality of chips being organized into at least one system row and into a number of system columns, said number of system columns being organized into the same number of groups as said partially good memory, said method comprising the steps of:

(a) organizing an addressable static RAM memory having a plurality of locations corresponding in number to at least the number of system rows times the number of internal rows or columns whichever is larger so that each location has a plurality of column address bit locations and a plurality of slice bit locations equal in number to said number of groups or slices and each being associated with a different one of said number of groups;

(b) testing said slices or groups of each partially good memory location for faults and forcing each of said plurality of slice bit locations to a first state when the group of bit locations associated therewith in a corresponding one of said partially good memory is detected as being faulty;

(c) searching said plurality of slice bit locations of each of said static memory locations for different types of faults; and, (d) assigning column addresses to each static memory location containing at least one slice bit location in said first state identifying locations in said good memory according to fault type so as to maximize the use of said good memory groups or slices.

28. The method according to claim 27 wherein step d further includes the steps of:

(1) assigning a next sequential column address to each static memory location representative of a first type of fault designated by said plurality of slice bit locations being in said first state indicating that all of said number of groups or slices of bits of the corresponding location of said partially good memory location are faulty;

(2) Upon completing step e, assign each next sequential column address to each static memory location containing a second type of fault corresponding to a multiple fault and a matching single fault designated by combinations of static memory locations in which all of the combined static memory slice bit locations of said locations are in said first state; and (3) Upon competing step f, assigning said next sequential column address to a plurality of static memory locations representative of a third type of fault corresponding to matching single faults in said plurality of matching static memory slice bit locations of all of said locations are in said first state therebyt minimizing the number of said good memory locations required for the operation of a defect-free system.

29. The method of claim 28 wherein said number of said groups is three and step e of assigning includes incrementing said next column address each time said next column address is written into said single static memory location for each triple fault and each time said next column address is written into the last of said two static memory locations.

30. The method of claim 28 wherein each steps 1 through 3 of step d include addressing said static memory in a predetermined manner so that each static memory location is addressed only once.

31. The method of claim 30 wherein step d further includes the steps of:
   (1) Testing said partially good memory to establish whether said partially good memory is constructed from RAM chips with row or column faults; and
   (2) Modifying the addressing of said static memory as a function of the testing in step 1.

* * * * *